(12) United States Patent
Eldridge et al.

(10) Patent No.: US 7,675,301 B2
(45) Date of Patent: Mar. 9, 2010

(54) ELECTRONIC COMPONENTS WITH PLURALITY OF CONTOURED MICROELECTRONIC SPRING CONTACTS

(75) Inventors: Benjamin N. Eldridge, Danville, CA (US); Stuart W. Wenzel, San Francisco, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/779,183

(22) Filed: Jul. 17, 2007

(65) Prior Publication Data
US 2007/0269997 A1 Nov. 22, 2007

Related U.S. Application Data

(60) Division of application No. 11/119,715, filed on May 2, 2005, now Pat. No. 7,245,137, which is a division of application No. 09/880,658, filed on Jun. 13, 2001, now Pat. No. 6,888,362, which is a continuation-in-part of application No. 09/795,772, filed on Feb. 27, 2001, now Pat. No. 6,780,001, which is a continuation-in-part of application No. 09/781,833, filed on Feb. 12, 2001, now Pat. No. 6,939,474, which is a continuation-in-part of application No. 09/710,539, filed on Nov. 9, 2000, now Pat. No. 7,189,077, which is a continuation-in-part of application No. 09/364,788, filed on Jul. 30, 1999, now Pat. No. 7,435,108.

(51) Int. Cl.
*G01R 31/26* (2006.01)

(52) U.S. Cl. ........................ 324/754; 324/762

(58) Field of Classification Search ........................ None
See application file for complete search history.

(56) References Cited

U.S. PATENT DOCUMENTS 3,173,737 A 3/1965 Kinkaid et al.
3,519,890 A 7/1970 Ashby
3,842,189 A 10/1974 Southgate (Continued)

FOREIGN PATENT DOCUMENTS

| EP | 632281 | 1/1995 |
|----|--------|--------|
| EP | 899538 | 3/1999 |
| JP | 58-191453 | 11/1983 |

(Continued)

OTHER PUBLICATIONS

U.S. Appl. No. 09/364,788, filed Jul. 30, 1999, Eldridge et al.

(Continued)

*Primary Examiner*—Vinh P Nguyen
(74) *Attorney, Agent, or Firm*—N. Kenneth Burraston

(57) ABSTRACT

An electronic component is disclosed, having a plurality of microelectronic spring contacts mounted to a planar face of the component. Each of the microelectronic spring contacts has a contoured beam, which may be formed of an integral layer of resilient material deposited over a contoured sacrificial substrate, and comprises a base mounted to the planar face of the component, a beam connected to the base at a first end of the beam, and a tip positioned at a free end of the beam opposite to the base. The beam has an unsupported span between its free end and its base. The microelectronic spring contacts are advantageously formed by depositing a resilient material over a molded, sacrificial substrate. The spring contacts may be provided with various innovative contoured shapes. In various embodiments of the invention, the electronic component comprises a semiconductor die, a semiconductor wafer, a LGA socket, an interposer, or a test head assembly.

23 Claims, 15 Drawing Sheets

U.S. PATENT DOCUMENTS

| | | | |
|---|---|---|---|
| 4,553,192 | A | 11/1985 | Babuka et al. |
| 4,615,573 | A | 10/1986 | White et al. |
| 4,772,228 | A | 9/1988 | Seymour |
| 4,893,172 | A | 1/1990 | Matsumoto et al. |
| H842 | H | 11/1990 | Ochs |
| 5,014,161 | A | 5/1991 | Lee et al. |
| 5,152,695 | A * | 10/1992 | Grabbe et al. ............... 439/71 |
| 5,172,053 | A * | 12/1992 | Itoyama ...................... 324/758 |
| 5,173,055 | A | 12/1992 | Grabbe |
| 5,210,939 | A | 5/1993 | Mallik et al. |
| 5,228,861 | A | 7/1993 | Grabbe |
| 5,286,208 | A | 2/1994 | Matsuoka |
| 5,462,440 | A | 10/1995 | Rothenberger |
| 5,513,430 | A * | 5/1996 | Yanof et al. ................... 29/846 |
| 5,534,784 | A | 7/1996 | Lum et al. |
| 5,555,422 | A | 9/1996 | Nakano |
| 5,576,630 | A | 11/1996 | Fujita |
| 5,599,194 | A | 2/1997 | Ozawa et al. |
| 5,613,861 | A | 3/1997 | Smith et al. |
| 5,632,631 | A | 5/1997 | Fjelstad et al. |
| 5,666,190 | A | 9/1997 | Quate et al. |
| 5,701,085 | A | 12/1997 | Malladi et al. |
| 5,772,451 | A * | 6/1998 | Dozier et al. ................. 439/70 |
| 5,810,609 | A | 9/1998 | Faraci et al. |
| 5,821,763 | A | 10/1998 | Beaman et al. |
| 5,829,128 | A | 11/1998 | Eldridge et al. |
| 5,914,614 | A | 6/1999 | Beaman et al. |
| 5,944,537 | A | 8/1999 | Smith et al. |
| 5,953,214 | A | 9/1999 | Dranchak et al. |
| 5,974,662 | A * | 11/1999 | Eldridge et al. ............... 29/842 |
| 5,994,152 | A | 11/1999 | Khandros et al. |
| 6,014,032 | A | 1/2000 | Maddix et al. |
| 6,016,061 | A | 1/2000 | Mizuta |
| 6,029,344 | A | 2/2000 | Khandros et al. |
| 6,031,282 | A | 2/2000 | Jones et al. |
| 6,059,982 | A | 5/2000 | Palagonia et al. |
| 6,064,213 | A | 5/2000 | Khandros et al. |
| 6,072,190 | A | 6/2000 | Watanabe et al. |
| 6,183,267 | B1 | 2/2001 | Marcus et al. |
| 6,184,053 | B1 | 2/2001 | Eldridge et al. |
| 6,184,576 | B1 | 2/2001 | Jones et al. |
| 6,214,631 | B1 | 4/2001 | Burrows et al. |
| 6,255,126 | B1 | 7/2001 | Mathieu et al. |
| 6,255,727 | B1 | 7/2001 | Khoury |
| 6,289,583 | B1 | 9/2001 | Belmont et al. |
| 6,307,392 | B1 | 10/2001 | Soejima et al. |
| 6,344,752 | B1 | 2/2002 | Hagihara et al. |
| 6,359,455 | B1 | 3/2002 | Takekoshi |
| 6,452,407 | B2 | 9/2002 | Khoury et al. |
| 6,482,013 | B2 * | 11/2002 | Eldridge et al. ............... 439/66 |
| 6,713,374 | B2 | 3/2004 | Eldridge et al. |
| 6,780,001 | B2 | 8/2004 | Eldridge et al. |
| 6,888,362 | B2 | 5/2005 | Eldridge et al. |
| 6,939,474 | B2 | 9/2005 | Eldridge et al. |
| 7,063,541 | B2 | 6/2006 | Grube et al. |
| 7,189,077 | B1 | 3/2007 | Eldridge et al. |
| 7,245,137 | B2 | 7/2007 | Eldridge et al. |
| 2002/0171133 | A1 | 11/2002 | Mok et al. |
| 2005/0016251 | A1 | 1/2005 | Eldridge et al. |
| 2006/0019027 | A1 | 1/2006 | Eldridge et al. |
| 2006/0085976 | A1 * | 4/2006 | Eldridge et al. ............... 29/874 |
| 2007/0045874 | A1 | 3/2007 | Eldridge et al. |
| 2008/0157799 | A1 * | 7/2008 | Gritters et al. ............. 324/762 |

FOREIGN PATENT DOCUMENTS

| | | |
|---|---|---|
| JP | 05-18741 | 1/1993 |
| JP | 05-198716 | 8/1993 |
| JP | 06-267408 | 9/1994 |
| JP | 07-21968 | 1/1995 |
| JP | 07-333232 | 12/1995 |
| JP | 08-306708 | 11/1996 |
| TW | 341747 | 10/1998 |
| WO | WO 91/12706 | 8/1991 |
| WO | WO 96/15458 | 5/1996 |
| WO | WO 96/16440 | 5/1996 |
| WO | WO 96/37332 | 11/1996 |
| WO | WO 97/44676 | 11/1997 |
| WO | WO 98/21597 | 5/1998 |
| WO | WO 98/52224 | 11/1998 |
| WO | WO 99/38229 | 7/1999 |
| WO | WO 00/33089 | 6/2000 |
| WO | WO 00/33096 | 6/2000 |
| WO | WO 01/09952 | 2/2001 |

OTHER PUBLICATIONS

U.S. Appl. No. 09/364,855, filed Jul. 30, 1999, Eldridge et al.

"A New Wafer Probe Interface Technology Using Complaint Microsprings, A Joint Study by Teradune, Inc. And FormFactor, Inc." Teradyne FormFactor White Paper (Jan. 30, 1998), pp. 1-18.

Novitsky et al., "FormFactor Introduces An Integrated Process For Wafer-Level Packaging, Burn-in Testing, And Module Level Assembly" (FormFactor Mar. 1999), 6 pages.

Khandros et al., "New Methods For Reducing Costs In Semiconductor Back-End," (FormFactor Jan. 30, 1998), 9 pages.

\* cited by examiner

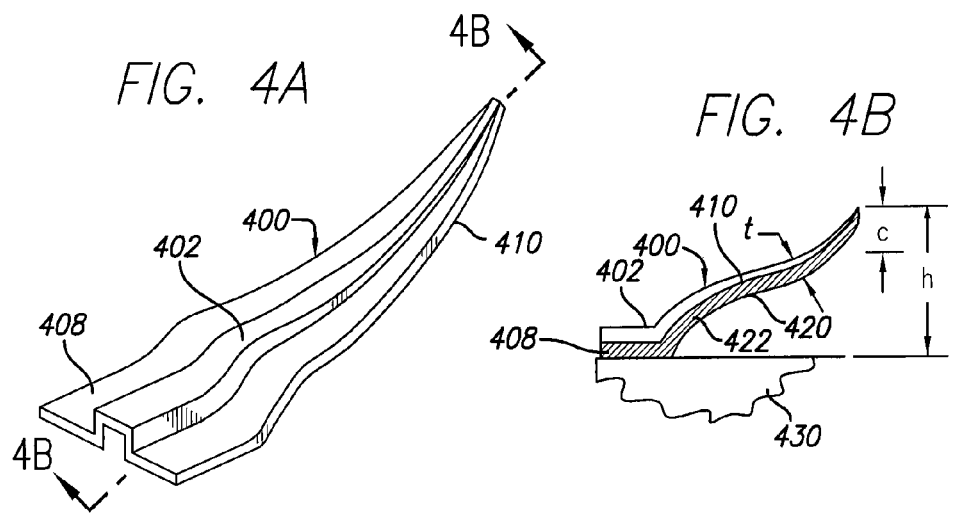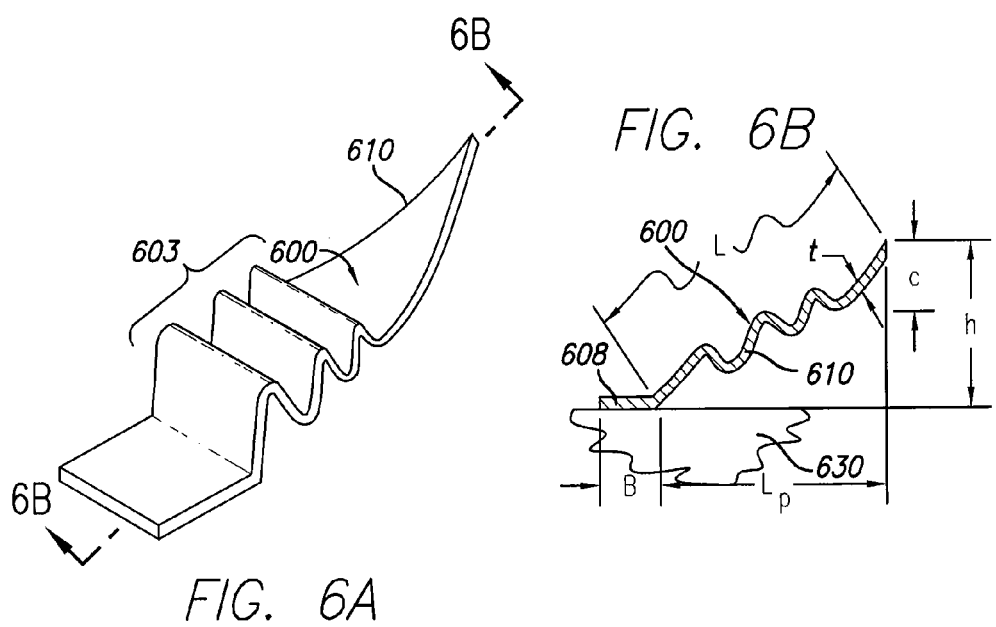

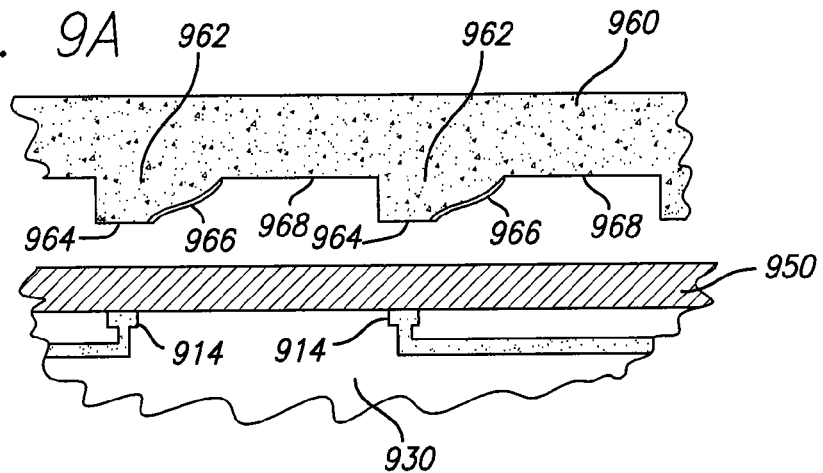
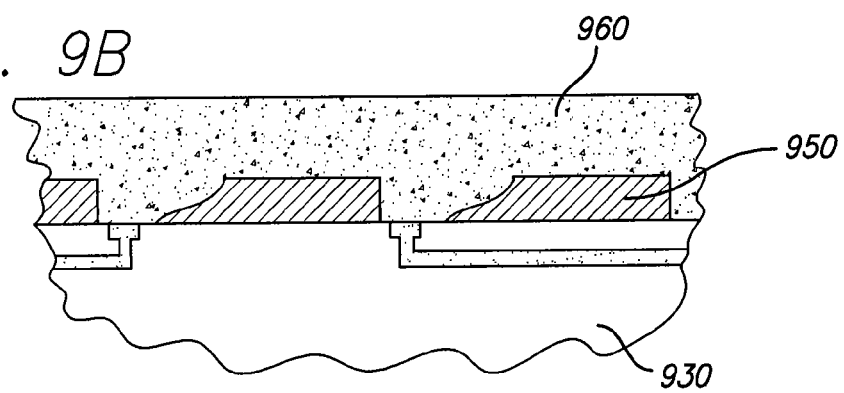
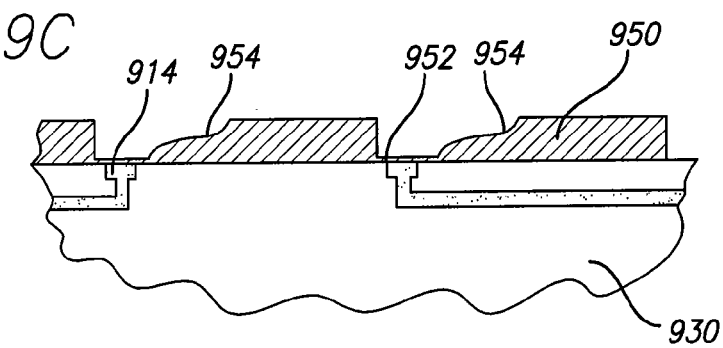
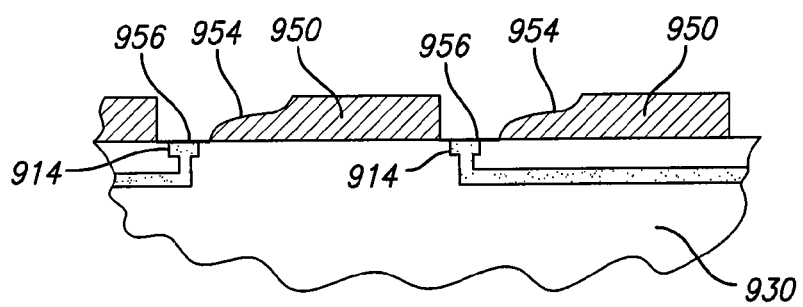

ELECTRONIC COMPONENTS WITH PLURALITY OF CONTOURED MICROELECTRONIC SPRING CONTACTS

RELATED APPLICATION

This application is a division of application Ser. No. 11/119,715, filed on May 2, 2005, now U.S. Pat. No. 7,245,137, which is a division of application Ser. No. 09/880,658, filed on Jun. 13, 2001, now U.S. Pat. No. 6,888,362, which is a continuation-in-part of patent application Ser. No. 09/795,772, filed Feb. 27, 2001, entitled "FORMING TOOL FOR FORMING A CONTOURED MICROELECTRONIC SPRING MOLD," by Eldridge and Wenzel, now U.S. Pat. No. 6,780,001, which is a continuation-in-part of U.S. patent application Ser. No. 09/781,833, filed Feb. 12, 2001, entitled "METHOD FOR FORMING 10 MICROELECTRONIC SPRING STRUCTURES ON A SUBSTRATE," by Eldridge and Wenzel, now U.S. Pat. No. 6,939,474 which is a continuation-in-part of U.S. patent application Ser. No. 09/710,539, filed Nov. 9, 2000, entitled "LITHOGRAPHIC SCALE MICROELECTRONIC SPRING STRUCTURES WITH IMPROVED CONTOURS," by Eldridge and Wenzel, now U.S. Pat. No. 7,189,077, which is a continuation in part of application Ser. No. 09/364,788, filed on Jul. 30, 1999, now U.S. Pat. No. 7,435,108 are incorporated herein, in their entirety, by reference, and which are collectively referred to herein as the "parent applications.

BACKGROUND OF THE INVENTION

1. Field of the Invention

The present invention relates to electronic component substrates with integrated resilient spring contacts in the field of semiconductor devices, and more particularly to dice, wafers, Leadless Grid Array ("LGA") sockets, and test head assemblies with resilient microelectronic spring contacts.

2. Description of Related Art

As semiconductor devices are made in increasingly smaller sizes, while at the same time becoming increasingly complex, semiconductor die size, and the size of contacts pads on such dice, has also shrunk. This trend towards ever-smaller and more powerful devices is projected to continue. The electronic components which use semiconductor devices are also being made in increasingly smaller sizes. New packaging technology, such as use of Chip Scale Packages ("CSPs") has evolved in response to these trends towards smaller packages, and more dense arrays of contacts.

The trend towards use of CSPs has led to new requirements in the field of semiconductor manufacturing and component assembly. Nearly all present and proposed CSPs use a solder ball as the first level interconnect element. In the field of testing, such CSPs require a wafer or device-level contactor that can consistently and reliably make contact with solder balls without requiring a costly or time-consuming cleaning step after each use. The contactor should also require a low contact force, deliver low electrical resistance and parasitics, and survive numerous testing cycles (such as several thousand compression cycles at high temperature). The contactor should also scale easily, regardless of the number of dice per wafer, the number of terminals (contact pads or solder balls) per die, wafer diameter, terminal pitch, and electrical performance required. For example, current contactors should be capable of contacting as many as 100,000 terminals per wafer, at operating frequencies as high as one Gigahertz. Still higher densities and operating frequencies are anticipated in the future. Of course, the contactor must deliver all of this performance at an economically favorable cost.

Compact solder ball interconnect elements also place demanding requirements on assembly of CSPs onto Printed Circuit Boards ("PCBs"). Silicon, as used in CSPs, has a rate of thermal expansion about five times less than the material typically used in PCBS. A soldered joint between such mismatched materials is subject to stresses from thermal cycling, which over time can weaken the joint and degrade the electrical performance of the soldered CSP/PCB system. Traditional approaches, such as underfilling, can reduce problems caused by mismatched thermal properties, but such approaches are difficult to scale down to increasingly smaller sizes. In addition, the use of solder as a joining material creates a potential source of Alpha particles, which can reduce the reliability of adjacent semiconductor devices.

Microelectronic spring contacts made from relatively soft wire that is ball-bonded to terminals of a semiconductor device or contactor, then plated with a harder material for resiliency, have been used successfully with solder-ball type CSPs in the field of semiconductor testing. Exemplary spring contacts of this type, referred to herein as "composite contacts," are disclosed, for example, in U.S. Pat. No. 5,476,211 (Khandros), which is incorporated herein by reference. Composite contacts have proven to be reliable and scaleable as required for modern semiconductor devices, and capable of repeatedly connecting to solder balls. Accordingly, composite contacts are well accepted in the field of semiconductor testing, where they are used on probe cards, interposers, Leadless Grid Arrays ("LGA") sockets, and other such test substrates. Use of composite contacts on a wafer-level tester, including directly on a semiconductor wafer under test, is disclosed in U.S. Pat. No. 6,064,213 (Khandros et al.), which is incorporated herein, in its entirety, by reference. Attaching the spring contacts to the wafer or device under test (as opposed to a test substrate) offers certain advantages. These advantages include lower duty cycle requirements for the contact, and primarily, the opportunity to use the spring contact as the primary interconnection element during both testing and final assembly, thereby eliminating the need for solder balls.

However, each composite contact must be individually attached at its base by a wire bond. The economics of individual wire-bonding can become unfavorable at volume mass-production levels, such as when individually attaching spring contacts to tens of thousands of terminals on a wafer containing high-volume production semiconductor devices. Hence, use of composite contacts has generally been limited to test substrates, such as probe card assemblies and LGA production sockets, or to relatively low-volume, high-performance devices. It has not yet been possible to provide improved resilient contact elements with performance as good or better than composite contacts, but that can also be mass-produced at a lower cost. It is desired, therefore, to provide wafer and semiconductor devices with such improved resilient contact elements. It is further desired to provide electronic component substrates, such as probe cards, wafer contactors, LGA sockets, and test head assemblies, with the benefits of such improved resilient contact elements.

SUMMARY OF THE INVENTION

Resilient microelectronic spring contact elements may be fabricated on a substrate in a parallel process, for example, as disclosed in the co-owned U.S. Pat. No. 6,184,053 B1. This patent discloses a method wherein a masking material may be applied to the surface of a substrate and patterned to have openings extending from areas on the substrate to positions which are above the surface of the substrate and which are also laterally offset from the areas. A conductive metallic material is deposited into the openings and is delimited thereby. A second conductive material may then be deposited over the delimited areas of the conductive metallic material to a thickness sufficient to impart resiliency to a free standing contact element. The masking material may then be removed to leave a free standing conductive and resilient contact element attached to the substrate. This method may be refined or modified in various ways, some of which are described in the '053 patent.

Using this method or a similar method, pluralities of microelectronic spring contact elements may be made together on a substrate. Spring contacts which are made by patterning a masking layer and depositing a conductive and resilient layer on the masking layer, and/or in openings of the masking layer, are referred to herein as "molded resilient contacts." In should be appreciated that other methods may be used to make microelectronic spring contact elements in parallel, mass produced processes, and integrally formed contacts made by such other processes may be suitable for use with the structures of the present invention. In general, "integrally formed" means deposited as a single, integral layer of material, and not assembled from discrete components that are affixed together. Methods for making integrally formed contacts need not necessarily require the use of a sacrificial masking layer, such as is used to make molded resilient contacts.

A particularly useful advancement in molded resilient contact is described in the co-pending parent applications referenced above. Using special shaping techniques, the masking layer and/or a moldable substrate is contoured in a direction perpendicular to the substrate, to provide a contoured mold. The resulting spring contacts, herein referred to as "contoured microelectronic spring contacts" or "contoured spring contacts," are a type of integrally formed contact. Integrally formed contacts, such as molded resilient contacts and contoured spring contacts, can provide performance comparable to composite contacts, with scalability to shrinking sizes and increasingly fine pitches equivalent or better than composite contacts, at potentially minimal manufacturing cost. The present invention exploits the advantages of integrally formed contacts, such as contoured spring contacts, by applying them to electronic components, such as semiconductor and test substrates of various kinds.

In an embodiment of the invention, a semiconductor wafer is provided with a plurality of integrally formed contacts, which are preferably contoured spring contacts. Each contact is preferably connected to one of the terminals on the wafer, either by directly mounting to a terminal, or through a redistribution trace. At least one stop structure is optionally provided adjacent to the spring contacts, to provide a mounting surface for a mating component and/or to prevent over-compression of the spring contacts. Typically, the spring contacts are configured with their contact tips aligned in substantially the same plane. However, contact tips may be disposed in different planes for mounting to a non-planar component, if required. The spring contacts may be all of an identical type or shape; or in the alternative, spring contacts of different types or shapes may be provided on the same wafer. In a related embodiment of the invention, an individual semiconductor die is provided with contoured spring contacts, either by being diced from a wafer as described above, or processed individually in like manner.

Semiconductor devices with contacts according to the present invention may be either socketed to a mating electronic component, or soldered. Underfill is not required and typically is not preferred. Instead, an unfilled gap between the device and the mating component allows for relative movement between the device and the mated component to accommodate differences in thermal expansion and contraction, and allows for venting of any trapped moisture or other unwanted volatile materials. An unfilled gap may also be advantageous for cooling the device, by providing an additional channel for forced convective cooling. A stop structure, if present between the device and the mated component, is preferably detached from at least one of the device or the mated component, and therefore permits relative movement to accommodate thermal expansion and contraction. When devices provided with contacts according to the invention are soldered to a mated component, solder need only be present on the distal end of each spring contact, thereby distancing it from the semiconductor device and greatly reducing the soft error rate caused by solder-generated Alpha particles.

In an alternative embodiment, an LGA socket is provided with molded resilient contacts, preferably contoured spring contacts. An LGA socket according to the present invention may be used in production and test environments, similarly to LGA sockets provided with composite spring contacts. In addition, because of the lower cost potential of contoured spring contacts, LGA sockets according to the present invention may be adapted for more widespread use as sockets in final assemblies. For example, an LGA socket according to the present invention may be used for connecting a microprocessor device to a printed circuit board.

In other embodiments of the invention, components of test head assemblies are provided with molded resilient contacts, contoured spring contacts and/or other microelectronic spring contacts. Components on which contoured spring contacts may be used according to the present invention include interposers, contactors, space transformers, and assemblies thereof. Similar components and assemblies provided with composite spring contacts are disclosed, for example, in U.S. Pat. No. 6,064,213, referenced above. The present invention provides comparable performance advantages at a potentially lower cost, using innovative contact structures and other components in new arrangements.

A more complete understanding of the electronic components with pluralities of contoured microelectronic spring contacts will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 4A is a perspective view of an exemplary contoured microelectronic spring contact according to the present invention, having a longitudinal rib extending along the beam of the spring contact.

FIG. 4B is a cross-sectional view of the spring contact shown in FIG. 4A, taken along the line indicated by arrows 4B.

FIG. 6A is a perspective view of an exemplary contoured microelectronic spring contact according to the present invention, having longitudinal corrugations.

FIG. 6B is a cross-sectional view of the spring contact shown in FIG. 6A, taken along the line indicated by arrows 6B.

FIGS. 9A-9H are side cross-sectional views of a process structure and materials layered thereon during exemplary sequential steps of a process for making a contoured microelectronic spring contact according to the present invention.

DETAILED DESCRIPTION OF THE PREFERRED EMBODIMENT

The present invention satisfies the need for an electronic component with a plurality of microelectronic spring contacts, that overcomes the limitations of prior art components provided with interconnection elements. In the detailed description that follows, like element numerals are used to describe like elements illustrated in one or more figures.

Contoured spring contacts according to the present invention are particularly well-suited to making electrical connections to microelectronic devices having contact pads disposed at a fine-pitch, or where a large array of economical microelectronic spring contacts is desired. "Fine-pitch" refers to microelectronic devices that have their contact pads disposed at a spacing of less than about 130 microns (5 mils), such as 65 microns (2.5 mils). However, structures of the present invention may also be used in coarser-pitch applications, if desired. The advantages of the present invention are realized in part from the close tolerances and small sizes that can be realized by using lithographic rather than mechanical techniques to fabricate the contact elements. However, the use of lithographic techniques does not, by itself, result in effective and reliable contact structures disposed at a fine-pitch. Contoured, microelectronic spring contacts according to the structures and forms disclosed herein provide a greatly increased probability of success, and a greatly extended range of applications, compared to microelectronic spring contacts having essentially linear beams with rectangular cross-sections.

Resilient contact structures, as known in the art, are subject to particular performance requirements, which vary in degree between applications. These requirements typically relate to contact force, wipe, clearance, contact angle, elastic range, z-extension, repeatability, electrical resistance, inductance, Hertzian stress at the contact tip, and longevity. The contact structures according to the present invention provide advantages for each of the foregoing performance areas, as is made apparent by the description that follows.

Semiconductor-mounted Microelectronic Spring Contacts

Figure 1A:
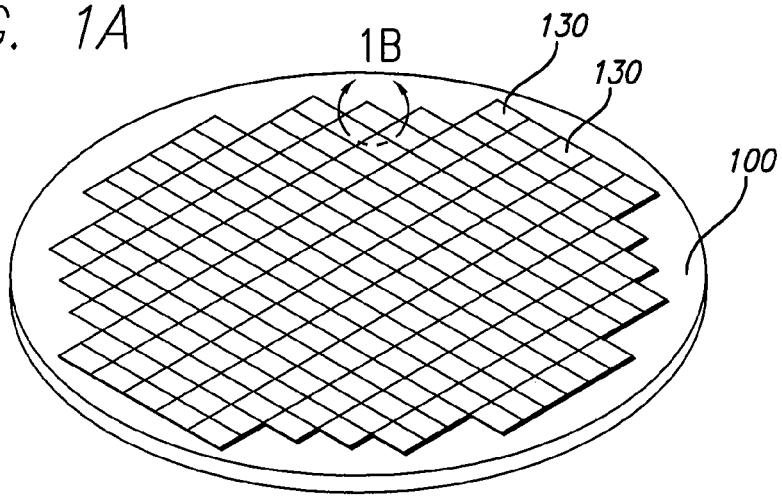
FIG. 1A is a perspective view of a semiconductor wafer having a plurality of dice, and a plurality of microelectronic spring contacts mounted to the face of the wafer.

Molded resilient contacts, and preferably, the contoured microelectronic spring contacts according to the present invention, are particularly suitable for mounting directly to semiconductor components, such as wafers and dice, where the spring contacts may function as the primary interconnection element for the integrated circuit devices on the wafer or die both during testing and during final assembly. The spring contacts may readily be fabricated in parallel, mass-production processes that add relatively little to the cost of a wafer, die, or other device, and are readily scaleable to increasingly finer pitches and higher contact densities. FIG. 1A shows an exemplary semiconductor wafer 100, such as a 200 mm wafer, comprising a plurality of unsingulated dice 130, each of which is provided with a plurality of contoured spring contacts and at least one stop structure. Because of the typically small scale of the spring contacts, the spring contacts are not visible in this wafer-level view.

Figure 1B:
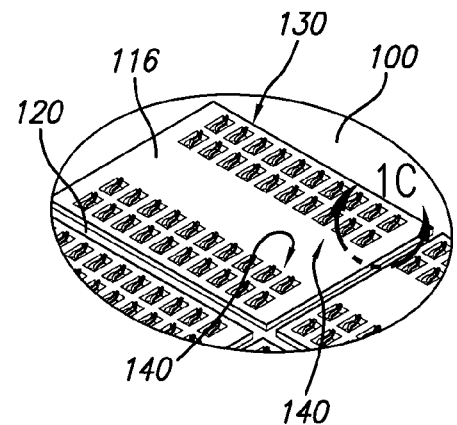
FIG. 1B is a detail view of the wafer shown in FIG. 1A, showing an array of microelectronic spring contacts on a die of the wafer.

FIG. 1B shows an enlarged view of an individual die 130, on which an array 140 of contoured spring contacts and a stop structure 116 are visible. A pattern of streets 120 separates each die 130 from its neighbors. Because of the small scale of the contoured spring contacts, structural details of the spring contacts are not visible in this die-level view. The exemplary array 140 comprises aligned rows of spring contacts and is relatively low-density, but it should be understood that the spring contacts may be provided on die 130 in any desired pattern or arrangement, and at much higher densities, finer pitches, and smaller sizes than shown in FIG. 1B. Conversely, somewhat larger sizes of contacts may also be provided, if required. A pattern of redistribution traces is optionally provided (in this view, such traces would be hidden by the stop structure 116) to connect each spring contact to a terminal of the semiconductor device.

Figure 1C:
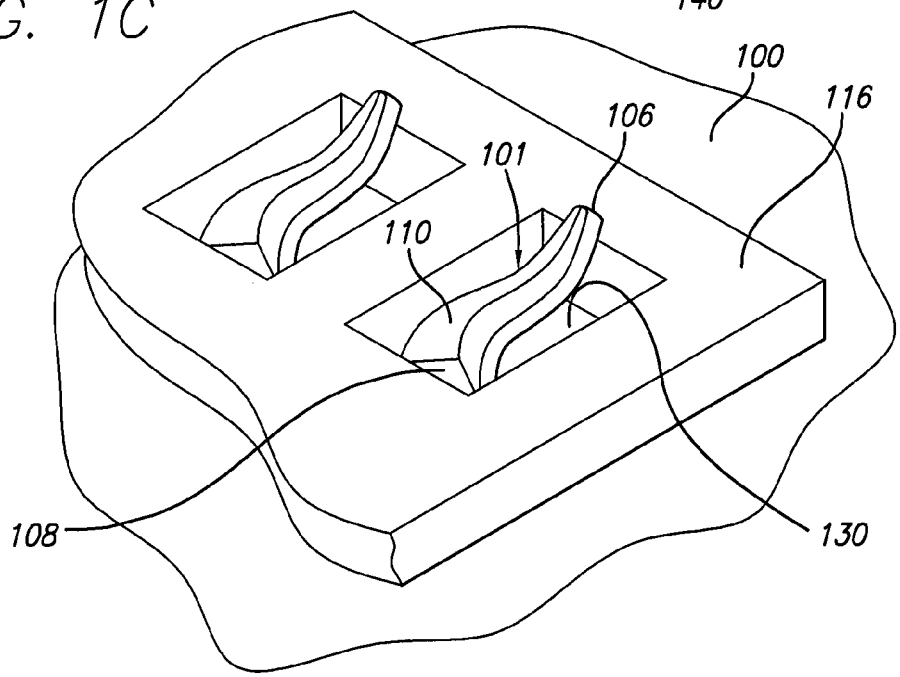
FIG. 1C is a detail view of the array shown in FIG. 1B, showing a contoured microelectronic spring and surrounding stop structure.

FIG. 1C shows an enlarged view of a single contoured spring contact 101 mounted to an upper surface of die 130. Spring contact 101 comprises a beam 110, which is preferably a contoured, essentially sheet-like beam (as shown), a contact tip 106 positioned adjacent to a free end of the beam, and a base 108 connected to a terminal of die 130, all of which are integrally formed of a resilient, conductive material (generally, one or more layers of metal). Beam 110 extends from a side of base 108 away from the upper surface of die 130 and beyond the distal (in this view, upper) surface of stop structure 116, preferable to a distance slightly less than the elastic range of the spring contact. Beam 110 preferably has a contoured, sheet-like shape as a consequence of being formed using a molding or equivalent process, as described herein. Stop structure 116 preferably comprises a non-conductive material, for example, a photo-resist such as SU-8, and may be configured as an integrated sheet that surrounds all of the spring contacts (as shown), or as discrete, substantially non-resilient protrusions of material having substantially co-planar surfaces distal from the surface of die 130. The contoured spring contacts 106 of the present invention may be provided in a wide variety of different shapes and configurations, without departing from the scope of the invention. Various exemplary shapes and configurations, and further details regarding contoured spring contacts, are provided in the detailed description that follows, and in the incorporated references.

Contoured Microelectronic Spring Contacts

Figure 2A:
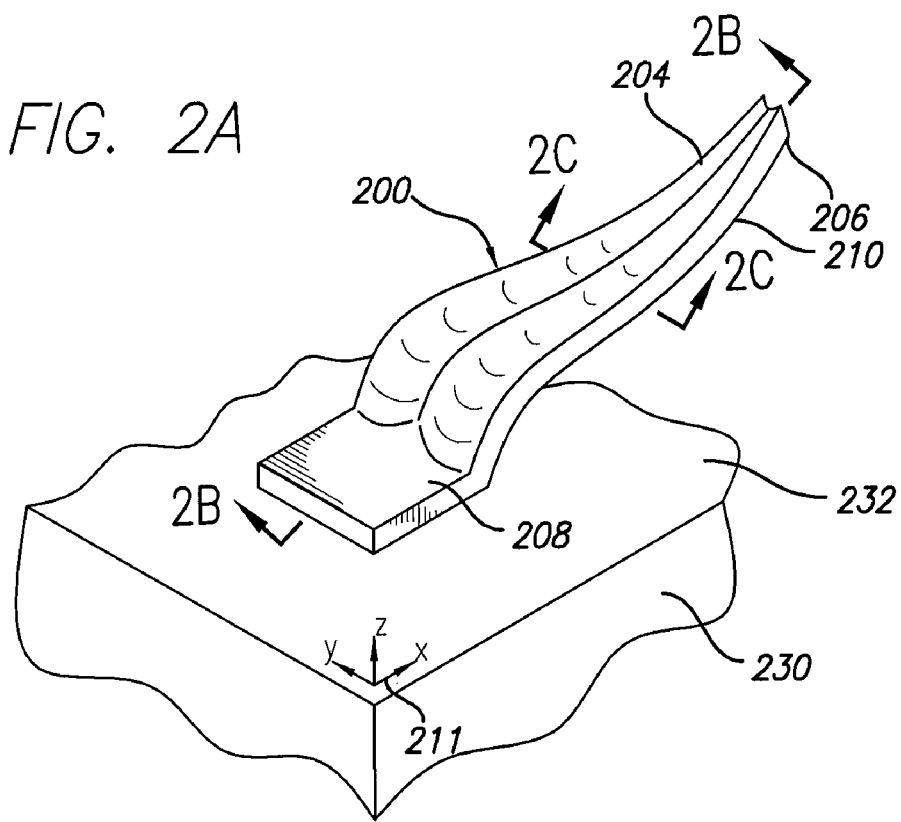
FIG. 2A is a perspective view of an exemplary contoured microelectronic spring contact according to the present invention, having a V-shaped cross-section.
Figure 2B:
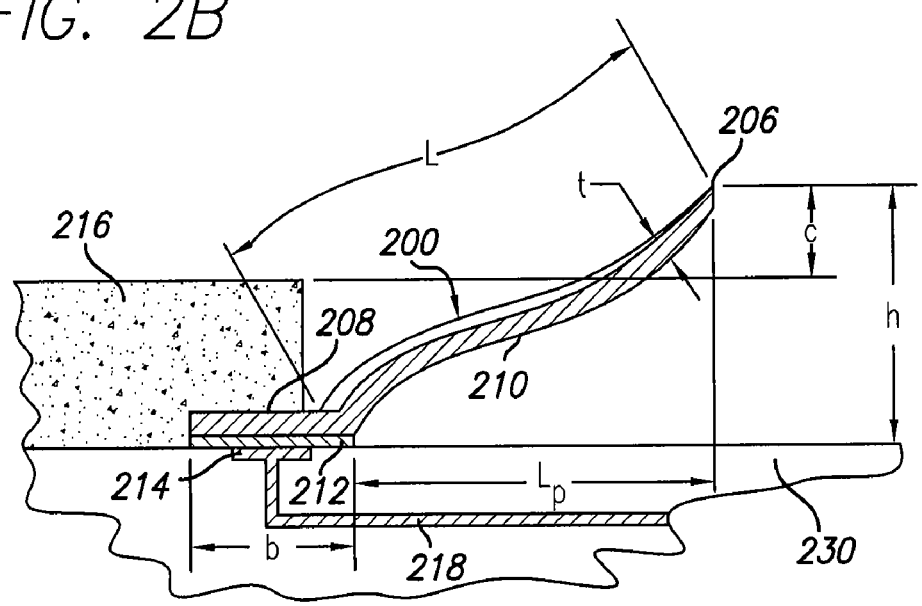
FIG. 2B is a cross-sectional view of the spring contact shown in FIG. 2A, taken along the line indicated by arrows 2B in FIG. 2A, additionally showing a stop structure disposed over the base of the spring contact.

An exemplary microelectronic spring contact for use on dice, wafers, and other substrates is shown in FIGS. 2A and 2B. The cross-section shown in FIG. 2B is taken along the line indicated by arrows 2B in FIG. 2A. As indicated by coordinate axes 211 and as used herein, the direction normal to substrate 230 is the z-axis direction; the direction parallel to the projected length of beam 210 onto substrate 230 is the x-axis direction; and the y-axis direction is normal to the plane defined by the z-axis and x-axis.

The microelectronic spring contact 200 of FIGS. 2A and 2B comprises a base 208 and a beam 210 integrally formed from at least one layer of electrically conductive, resilient material. Substrate 230 is typically a semiconductor substrate for an integrated circuit having numerous electrical terminals, one of which is shown as the contact pad 214 in FIG. 2A.

Contact pads, such as contact pad 214, are typically coupled by conductive traces, such as trace 218, to internal circuitry within the integrated circuit. As known in the semiconductor art, substrate 230 is typically comprised of numerous layers, such as insulating layers interposed with conducting and semiconducting layers, and a passivating layer optionally provided on the top surface 232 of the substrate 230. The passivating layer may be an insulating layer, a polysilicon layer, or other layers as known in the art. In some embodiments of the invention, a contact pad 214 is electrically and mechanically coupled to an intermediate conducting layer 212 which is disposed above it, as shown in FIG. 2B. When present, intermediate layer 212 is typically a manufacturing artifact of a shorting layer used during an electroplating step of a process for forming the microelectronic spring contact. A stop structure 216, as further described in the co-pending application Ser. No. 09/364,855, filed Jul. 30, 1999, entitled "INTERCONNECT ASSEMBLIES AND METHODS," by Eldridge and Mathieu, which is hereby incorporated herein by reference, is optionally provided to prevent over-compression of spring contact 200. Spring contact 200 provides for conduction of electrical signals and/or power between a tip 206 of beam 210, through the beam 210 of resilient material, intermediate layer 212, and contact pad 214, and finally through conductive trace 218 to an integrated circuit in substrate 230. It should be appreciated that the microelectronic spring contact 200 of FIGS. 2A and 2B may also be used for other types of interconnect assemblies, such as probe card assemblies, interposers, and other connection systems where electrical contact to or through a electronic component substrate is desired.

Microelectronic contact structures according to the present invention are typically configured as a cantilevered beam, having a fixed base and a free end (tip), as described above. The beam is preferably blended smoothly at its ends to the base and the free tip. This basic geometry is preferred for contoured, microelectronic spring contact structures according to the invention for several reasons. Integrated circuit manufacturing processes, unlike alternative spring manufacturing processes such as wire forming, are best suited for making shapes that may be defined by projection onto a surface, such as by pattern masking. Such shapes are capable of being formed in a single step of a manufacturing process. In contrast, certain three dimensional curves commonly found in wire-formed spring contacts, cross over themselves and cannot be defined by projection onto a surface. Such shapes therefore require multiple manufacturing steps to assemble, and cannot be made as a single, integrally formed piece using conventional integrated circuit manufacturing processes. Therefore, the cantilevered beam configuration is desirable for lithographic spring contacts because fewer process steps are required, and the spring contact can be formed from an integrated mass of material. Additionally, the cantilevered beam is capable of resilient motion in at least two dimensions, thereby providing both wipe (desirable for making an electrical connection) and z-deflection, for compensating for misalignment between substrates, and for providing the spring force needed for maintaining an electrical connection.

Beam 210 is preferably tapered from a relatively wide width at its fixed base to a relatively narrow width at its tip, to compensate for stress distribution in the cantilevered beam. Such triangular-shaped beams are relatively more structurally "efficient" (providing a higher contact force for a beam of given mass) than rectangular shaped beams of the same cross-sectional shape. However, a triangular shape may be less electrically efficient, because its current-carrying capacity is constrained by the relatively small beam cross-section near the tip of a triangular beam. Thus, for certain applications, beams of constant cross-section may be preferred. Spring beams according to the present invention may thus be tapered, and/or be provided with constant cross-sectional areas, depending on the requirements of the application.

In addition, spring beams according to the present invention are preferably contoured across their width and along their length. Contouring along the length of the beam may provide a more favorable deflected shape of the beam for purposes of making an electrical connection between two substrates. Contouring across the width of the beam provides cross-sectional shapes having higher area moments of inertia, compared to beams of the same mass having solid rectangular cross-sections. As is well understood in the structural arts, the stiffness of a beam of a given mass per unit length can be dramatically improved by altering its cross-sectional shape. For example, a box beam is much stiffer than a solid rectangular rod having the same mass per unit length. Heretofore, it has not been feasible to provide contoured microelectronic contact structures with beams having higher area moments of inertia than provided by solid rectangular cross-sections, at the small scale afforded by the present invention. Also, there has been little or no motivation to reduce beam masses, because the cost of beam material for microelectronic spring contacts at small scales is not significant. However, according to the present invention, it is highly desirable to reduce the mass of beam material in order to reduce the fabrication time required and the area occupied in a top down view of the structure, which determines the packing ability or minimum pitch at which the spring contacts may be mounted to a surface.

The theories and mathematical tools for predicting the structural properties of a contoured spring contact are well known in the art. Computational tools, such as finite element methods, further make it possible to refine and optimize the shape of complex spring contacts in view of a variety of different loading conditions. Thus, using the contoured shapes according to the present invention, it is now possible to construct microelectronic spring contacts that have a much wider range of performance properties than heretofore possible, while using processes adapted from conventional manufacturing of integrated circuits. In particular, the area moment of inertia, and thus the spring rate, can be greatly increased by contouring the beam across its width. Additionally, the spring shape can also be optimized to reduce stress concentration, resulting in more efficient use of material. Width-contoured spring contacts can thus be made with much less material than required for flat cross-section microelectronic spring contacts of a comparable spring rate and strength.

Reducing the amount of material in a spring contact permits increased processing throughput by decreasing the time required for depositing the material. In addition, thin-layer deposition techniques that were previously considered too slow or costly for thick layers may be viable. For example, a flat spring design might require a material thickness of 25 microns (about 1 mil) to achieve a desired spring rate. Material of this thickness is typically deposited by electroplating, which is known for high throughput and cost-effectiveness in layers of this thickness. In contrast, a spring contoured according to the present invention can achieve the same spring rate using less material, for example, with only 5 microns (0.2 mils) of material thickness. If electroplating is used, the processing throughput would be about 5 times higher for the contoured spring contact. Additionally, CVD (chemical vapor deposition) and PVD (physical vapor deposition), typically limited to depositing layers up to about 5 microns thick, become viable alternative deposition methods for the spring metal.

Figure 2C:
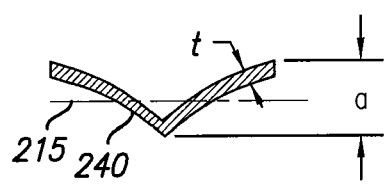
FIG. 2C shows a cross-sectional view, taken along the line indicated by arrows 2C in FIG. 2A, of an exemplary V-shaped section of a spring contact according to the present invention.

Referring again to FIGS. 2A and 2B, contouring of spring beam 210 is visible in both views. Beam 210 is preferably contoured across its width, for example, as shown in FIG. 2A illustrating a V-shaped beam. An exemplary V-shaped cross-section of the beam, having a constant thickness "t," is shown in more detail in FIG. 2C. It will be understood that an approximately constant thickness is a typical result of deposition processes such as electroplating, electroless plating, CVD, and PVD. From a comparison of the V-shape 240 shown in FIG. 2C to the flat rectangular cross-section 242 of equivalent thickness shown in FIG. 2E, it is evident that the V-shaped cross-section has a substantially greater area moment of inertia, because the extension "a" of the shape across the neutral axis 215 is much greater. Thus, a V-shaped cross-section or other contour may be provided wherever the beam 210 is desired to be stiffened. In the case of beam 210 shown in FIG. 2A, the V-shape is provided along the entire length of beam. If desired, however, the contoured cross-sectional shape may be provided along only a portion of the beam length, or may be altered to provide varying beam stiffness along the length of beam. This may be desirable where a portion of the beam, for example, a tip portion, is designed to be relatively flexible compared to a different portion, for example, a portion near the base of the spring contact.

Figure 2D:
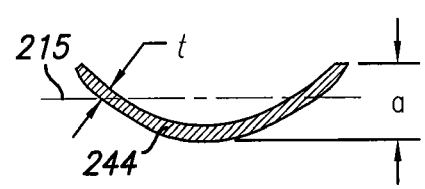
FIG. 2D shows a cross-section of an exemplary U-shaped section of a spring contact according to the present invention, viewed similarly to FIG. 2C.
Figure 2E:
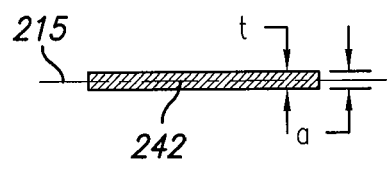
FIG. 2E shows a cross-section of an exemplary spring contact with a flat rectangular cross-section, viewed similarly to FIG. 2C.
Figure 3:
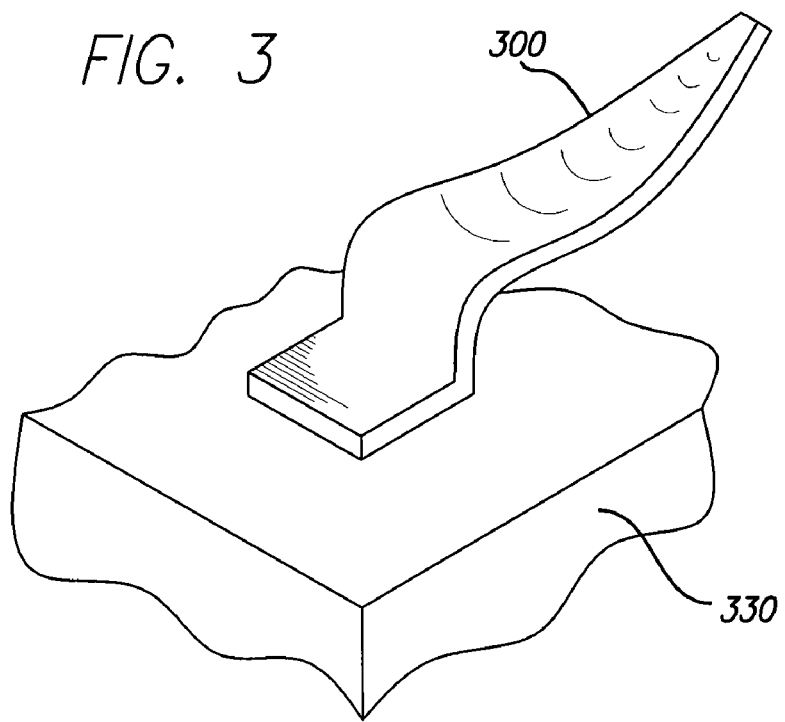
FIG. 3 is a perspective view of an exemplary contoured microelectronic spring contact according to the present invention, having a U-shaped cross-section.

The present invention provides for spring contacts with specific properties, such as specific spring rates, by contouring the beam shape. FIGS. 3-6B show exemplary alternative shapes for contoured beams according to the invention. An exemplary U-shaped beam 300 on a substrate 330 is shown in FIG. 3. U-shaped beam 300 has a cross-section 244 as shown in FIG. 2D. Similarly to the V-shaped cross-section shown in FIG. 2C, the U-shaped cross-section 244 has a substantially higher area moment of inertia relative to a beam with a flat rectangular cross-section. The U-shaped cross-section avoids the notch in the base of the V-shape, which may cause undesirable stress concentration. However, the choice of a U-shaped cross-section relative to other sectional shapes may depend on considerations other than spring rate or other spring performance parameters. For example, manufacturability is an important consideration. Depending on the preferred manufacturing method, a particular shape, such as the U-shape, may be less costly to manufacture than other shapes.

Figure 2F:
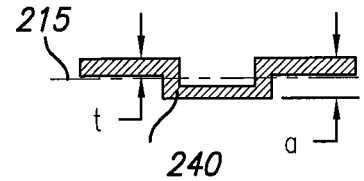
FIG. 2F shows a cross-section of an exemplary ribbed spring contact according to the present invention, viewed similarly to FIG. 2C.
Figure 5:
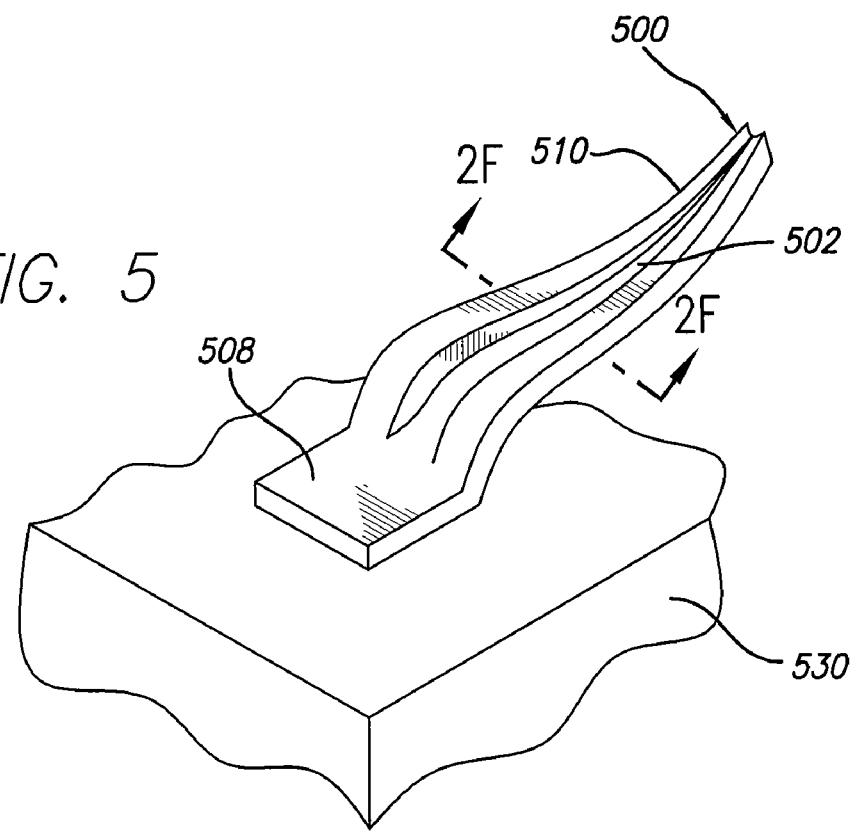
FIG. 5 is a perspective view of another exemplary contoured microelectronic spring contact according to the present invention, having a longitudinal rib extending along the beam of the spring contact.

FIGS. 4A and 5 show various ribbed beams. FIG. 4A shows a ribbed spring contact 400 with a beam 410 having a rib 402 disposed above the surface of the beam. In structure 400, rib 402 runs the entire length of the beam and base 408. As shown in FIG. 4B, spring contact 400 is also preferably contoured lengthwise along a compound curve 420, as described in more detail in the parent application, Ser. No. 09/710,539 referenced above. Rib 402 preferably follows the contour of curve 420, although it may optionally be tapered in the z-direction to approach the upper surface of beam 410 at its tip, as shown. FIG. 5 shows spring contact 500 having a contoured beam 510 with a rib 502 disposed beneath the beam. Rib 502 is terminated at an edge of base 508. Ribbed beams may be somewhat more costly to fabricate than V-shaped or U-shaped beams, because their more intricate shapes may require more intricate tooling and greater care during forming operations, but can provide certain advantages. One advantage is that ribs can be placed across the width of a beam wherever greater stiffness is desired. For example, as shown in FIG. 2F, ribs may be placed towards the edges of a beam to stiffen the beam against torsion. This may be desirable where a beam is offset from a straight line, such as a serpentine or "C-shaped" beam as further described below and in the parent application Ser. No. 09/710,539. Offset beams are subject to torsion in portions of the beam, and properly placed ribs can stiffen an offset beam against torsion, where desired. Another advantage is that a rib can be extended into the base of a microelectronic spring contact, as shown in FIGS. 4A and 4B. This prevents stress concentration and beam failure at the juncture 422 between base 408 and beam 410, that can result from abrupt changes in cross-sectional shape along a beam. Ribs 402 according to the present invention are preferably comprised of a folded portion of the beam 410, as shown in each of the foregoing FIGS. 2F and 4A-5. The folded portion is preferably configured so that no portion of the rib overlaps the beam, when viewed from above the beam looking towards the substrate. Non-overlapping, folded ribs are readily formed by deposition of a layer of material over a molded form. A folded rib generally has the same thickness "t" as the beam, such as beams 410 and 510, and forms an integral portion of the beam. The cross-section of ribs may be rectangular, triangular, cylindrical, or almost any other desired non-overlapping shape, and may taper in width or height along the length of the spring beam.

Contouring according to the present invention can be used for a completely different purpose, apart from providing an increased area moment of inertia for stiffening the spring contact, as described above. A spring contact may also be lengthwise contoured to decrease its "footprint," i.e., the amount of projected area the spring occupies on a substrate. FIG. 6A shows a corrugated spring contact 600 that is contoured to decrease its footprint. An exemplary shape of the corrugations is shown in edge view in FIG. 6B. It should be apparent that the corrugations, like ribs, are readily formed by depositing a layer of resilient material over a contoured sacrificial layer, according to the method described below. It should be further apparent that the ratio of the length "L" of the beam 610 to its projected length "$L_p$" on substrate 630 is increased by the corrugations. For a cantilevered beam spring contacts having the same ratio of thickness to length (i.e., "the same "t/L"), the elastic range is directly proportional to the spring length "L." Accordingly, the corrugations can provide a greater elastic range "c" and a higher elastic deflection ratio ("c/h") than an uncorrugated beam of equivalent projected length and z-extension, so long as the beam thickness of the spring contact is increased in proportion to the increase in spring length.

A further advantage of a corrugated spring contact is that the bending moment experienced by the spring base for a given force applied at the spring tip is reduced proportionally to the reduction of projected length "$L_p$." Reducing the bending moment at the base reduces the spring base area required to achieve adequate adhesion of the spring contact to the substrate. A reduced base area, in turn, further reduces the footprint of the spring contact. Additionally, corrugations provide resiliency in the horizontal plane, parallel to the substrate (i.e., in the "x-y plane"). That is, corrugated spring contacts can be made more mechanically compliant in the x-y plane than straight and convex designs. This is advantageous where the spring tip will be fixed in place (e.g., if the spring tip will be soldered to a mating contact pad). The resiliency in the x-y plane compensates for thermal expansion differentials, misalignment, vibration and other stresses between connected components, thereby increasing the reliability of the connection.

Figure 7:
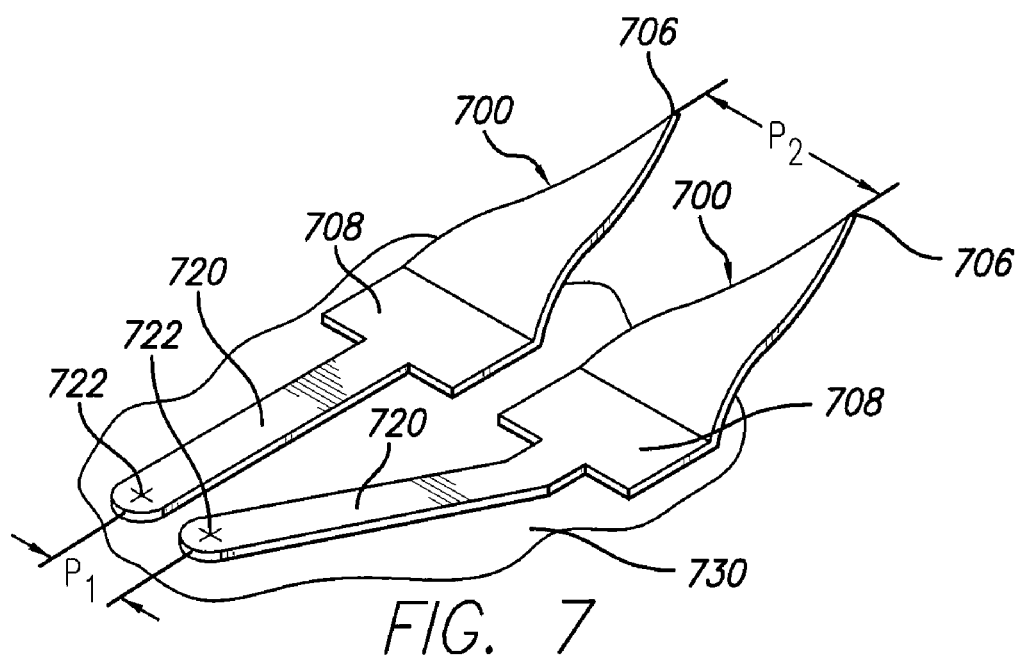
FIG. 7 is a perspective view of an exemplary two of many microelectronic spring contacts with integral redistribution traces for use with electronic components according to the invention.

Microelectronic spring contacts may be provided with integral redistribution traces, thereby reducing the cost of providing space transformation (either from a compact arrangement to a less compact arrangement, or vice-versa) to an array of terminals. FIG. 7 shows an exemplary plurality (two of many shown) of contoured microelectronic spring contacts 700, each with an integral redistribution trace 720. Each trace 720 is preferably formed simultaneously with the base 708 and cantilever beam of structures 700, such as by using a patterned deposition technique as previously described herein, or in the incorporated references. Pitch spreading, such as from a pitch "P1" at terminals 722, to a larger pitch "P2" at contact tips 706, may thus readily be achieved in a single process step. Integral redistribution traces have not been contemplated and are not feasible for prior art microelectronic spring contacts. However, the process according to the present invention is suitable for use with integral traces because the base 708 of the spring contact may be formed on the underlying substrate in much the same way as a redistribution trace. Greater stiffness and strength may be provided to the beam of structure 700 by a subsequent deposition step, for example, by plating the base and beam of structure 700 with an additional layer of resilient material, while optionally masking the integral redistribution trace 720.

Figure 8:
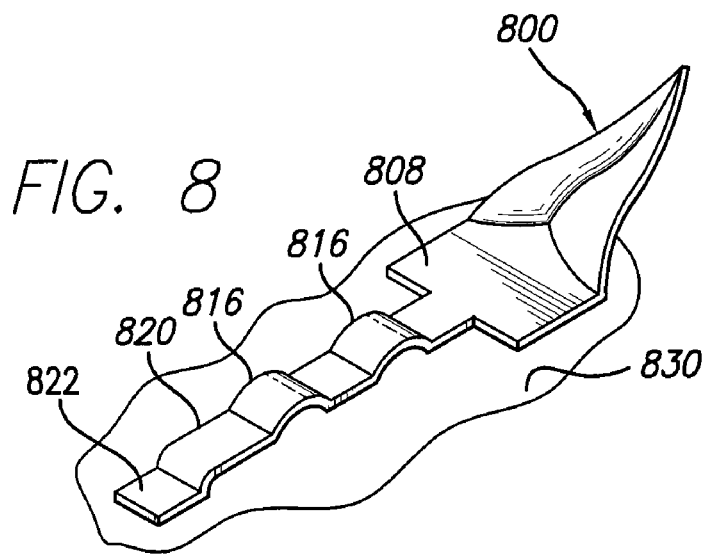
FIG. 8 is a perspective view of an exemplary microelectronic spring with an integral redistribution trace having raised arches.

Other structures may additionally be integrally formed with a spring contact according to the present invention. FIG. 8 shows a spring contact 800 having one or more raised bumps or arches 816 integral therewith. Raised arches 816 are shown in the relatively narrow integral redistribution trace 820, but it should be apparent that similar raised features may be provided in the base 808, or in a separate location on substrate 830. Raised features or arches 816 may function as stop structures for spring contact 800, thereby reducing or eliminating the need to form a stop structure in a separate step. When provided in a redistribution trace, as shown in FIG. 8, an arch may provide the additional or alternative function of stress relief for the trace 820 and/or between the spring contact 800 and trace 820. A further possible configuration and function for a raised feature is as a protruding, substantially non-resilient interconnection element. It should be apparent that various types of raised features may be provided using the same process steps as used to mold the contoured spring contact 800, e.g., by forming a protrusion of moldable substrate and then depositing a resilient material on the protrusion. The moldable substrate under the protrusion may be removed in a subsequent process step (as it is under a spring contact), or left in place, depending on the desired function of the raised feature. Raised features may be semi-cylindrical in shape, as shown, or in other open tubular shapes such as square, rectangular, or triangular. Raised features may also comprise closed shapes such as hemispheres, cubes, inverted cones, pyramids, and the like, especially for applications for which it is not necessary or desirable to remove the moldable substrate under the raised feature. Furthermore, as discussed above with respect to structure 700, resilient material may be deposited to different depths on any selected ones of the raised arches 816, redistribution trace 820, or spring contact 800 using a series of pattern masking and depositing steps, as disclosed in the incorporated references.

Method for Making Contoured Spring Contacts

Contoured spring contacts may be formed by depositing an integrated layer of resilient material over a contoured sacrificial layer, sometimes referred to herein as "molding." The layer of resilient material is preferably built up on the sacrificial layer as a conformal coating deposited by a method such as electroplating. An embodiment of this molding technique for making contoured spring contacts according to the present invention is illustrated in FIGS. 9A-9H. The fabrication of a single contact structure will be described as exemplary of fabricating a plurality of such contact structures, preferably all at the same time on the same electronic component. For many applications, each of the contact structures fabricated on a single component will be substantially identical to one another. In the alternative, the dimensions and shape of each contact structure can individually be controlled and determined by the designer for given application requirements, and fabricated using the method described herein as will be apparent to one skilled in the art.

The method described herein is provided as merely exemplary of a particularly suitable way of making integrally formed spring contacts, and especially contoured spring contacts. The example is not intended to limit the invention. For example, the invention is not limited to structures that make use of spring contacts that are formed using a sacrificial layer. To the extent that similar spring contacts may be formed without using a sacrificial layer, such spring contacts may be adapted for use with the present invention.

Referring to FIG. 9A, in a preparatory step of a method for making a contoured spring contact, an electronic component substrate 930, optionally provided with contact pads 914 for connecting to an integrated circuit, is coated with a moldable sacrificial layer 950. Sacrificial layer 950 may be any number of materials, such as PMMA (poly methyl methacrylate), which can be coated on a substrate to the desired thickness, which will deform when pressed with a mold or stamp, which will receive the resilient material to be deposited thereon, and which can then readily be removed without damaging the spring contacts 900. Additional candidate materials for layer 950 include acrylic polymers, polycarbonate, polyurethane, ABS plastic, various photo-resist resins such as Novolac resins, epoxies and waxes. The sacrificial layer 950 preferably has a uniform thickness sufficient to provide a mold form slightly deeper than the desired z-extension "h" of the finished spring contacts. For example, if the desired z-extension is 50 microns (about 2 mils), layer 950 may have a thickness, after being impressed with tool 960, of 55 microns (2.2 mils). Various methods known in the art, for example, spin coating and lamination, may be used to deposit layer 950 onto substrate 930.

Also, a forming tool 960, having a molding face provided with different molding regions 964, 966, and 968, is prepared for molding sacrificial layer 950. Various methods may be used to prepare tool 960, as described in more detail below and in the incorporated references. Maximally protruding molding areas 964 of tool 960 are used for deforming the sacrificial layer 950 in the area of the contact pads 914, where the bases 908 of contact structures 900 will be formed. Contoured molding regions 966 are used for deforming layer 950 where the contoured beams 910 of contact structures 900 will be formed. In FIG. 9A, a contoured region for making a V-shaped beam is shown in lengthwise cross-section. An embossing tooth 962 may be provided with at least one maximally protruding region 964 and at least one contoured region 966. Maximally recessed molding regions 968 are used for receiving excess material, i.e., "flash," pushed aside by teeth 962. Molding regions 968 may be used to define spacing between adjacent spring contacts 900 on substrate 930. Alternatively, or in addition, spacing may be determined by a subsequent patterning step. Depending on the choice of materials for sacrificial layer 950 and forming tool 960, a layer of mold release material (not shown) is optionally provided on the molding face of tool 960. It should be recognized that further layers and material may be present on substrate 930 without departing from the method described herein. For example, a metallic shorting layer (not shown) is optionally provided between layer 950 and substrate 930, to protect any integrated circuits embedded in the substrate during processing operations.

In a molding step illustrated in FIG. 9B, the forming tool 960 is applied against substrate 930 with sufficient pressure to bring the maximally protruding areas 964 of teeth 962 nearly to the surface of substrate 930, and to fully mold layer 950 in all contoured molding regions 966. To avoid damaging substrate 930, teeth 962 are preferably not brought into contact with substrate 930. In a preferred embodiment, when teeth 962 have sunk into layer 950 to the desired depth, flash substantially fills the maximally recessed regions 968 to form a surface sufficiently uniform to permit later deposition of a layer of masking material between the spring contacts after the forming tool 960 is removed from layer 950. Forming tool 960 may be heated to assist deformation of layer 950, and then cooled to harden layer 950 into place. In an alternative embodiment, layer 950 is selected of a material that is sufficiently deformable to flow under pressure without application of heat, and sufficiently viscous to hold its shape after tool 960 is removed. In yet another alternative embodiment, heat, UV light, or chemical catalysts are used to harden sacrificial layer 950 while under forming tool 960, and then the tool is removed. Whatever molding technique is used, the cycle times are preferably relatively short to permit faster manufacturing throughput.

FIG. 9C shows the shape of the sacrificial layer 950 after removal of the forming tool 960. A thin layer of residue 952 is present over the area of each contact pad 914. Negative mold surfaces 954 are also present, each bearing a negative impression or "plug" of the contoured beams to be formed therein. It is necessary to remove the residue 952 in order to expose the substrate 930 in the areas where the bases 908 of the contact structures 900 will be formed. To remove the residue 952, the entire substrate with its molded layer 950 may be isotropically etched by immersion in a bath of etchants, by oxygen plasma, or other method as known in the art. Isotropic etching is suitable for relatively flat substrates for which the residue layer 952 is of a uniform thickness in all places where the spring bases 28 will be formed. Preferably, the isotropic etch is performed so as to remove the residue 952 while at the same time reducing the thickness of layer 950 to equal the desired z-extension of the finished spring contacts 900. In the alternative, an anisotropic etching method that etches more rapidly in the z-direction, such as reactive ion etching, may be used. A z-anisotropic etch is preferably used in cases where the substrate is relatively uneven, and the thickness of residue 952 is not uniform across substrate 930.

The appearance of the molded sacrificial layer 950 after etching is shown in FIG. 9D. The contact pads 914 are preferably exposed, along with a surrounding exposed area 956 of substrate 930 sufficient for providing adhesion of the base 908. In typical semiconductor applications, an exposed area 956 of between about 10,000 and about 40,000 square microns, most preferably in excess of about 30,000 square microns, is provided. After etching, the mold surfaces 954 preferably take on the desired contoured shape, and the distal tips of all mold surfaces 954 on substrate 930 are preferably within essentially the same plane.

Figure 9E:
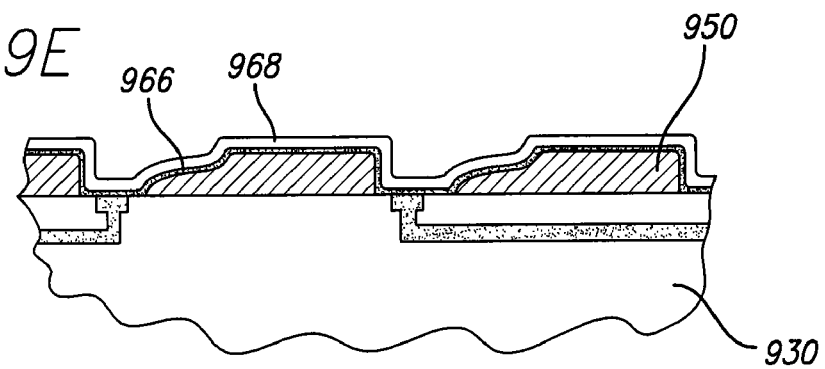

FIG. 9E shows substrate 930 after application of a seed layer 966 and a masking layer 968. The seed layer is typically a relatively thin layer, such as about 4500 Å (Angstroms; or about 0.45 microns) thick, of sputtered metal for electroplating the resilient spring material. In the alternative, surface modifications of layer 950, e.g. plasma treatment, may be used to render it conductive, thereby providing the conductivity needed for electroplating. It should be appreciated that in FIGS. 9E-9H, the relative thickness of seed layer 966 is exaggerated. Masking layer 968 may be selected from various commercially available photoresist materials, such as an electrodeposited resist, Novolac liquid resists, or a negative-acting dry film photo-resist. Masking layer 968 is cured in an appropriate manner, for example by exposing it to UV light through a pattern mask, except where the spring contacts are to be formed. The uncured portions of masking layer 968 are then dissolved away by a suitable solvent, as known in the art.

Figure 9F:
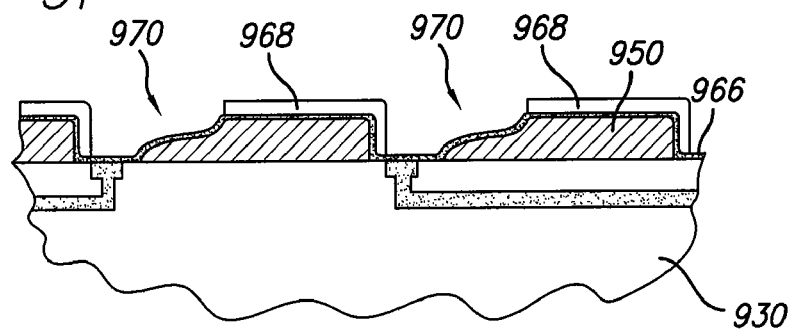
Figure 9G:
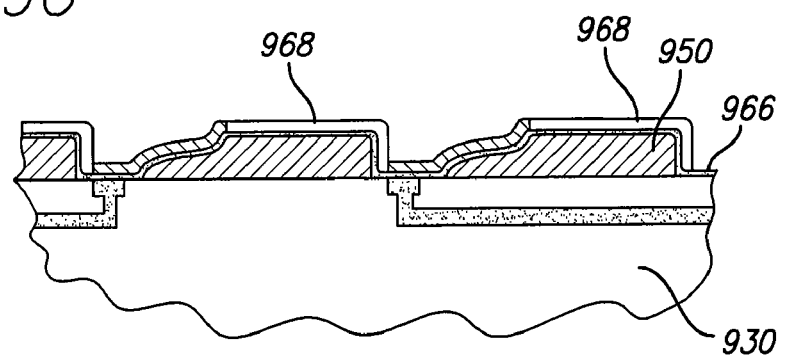
Figure 9H:
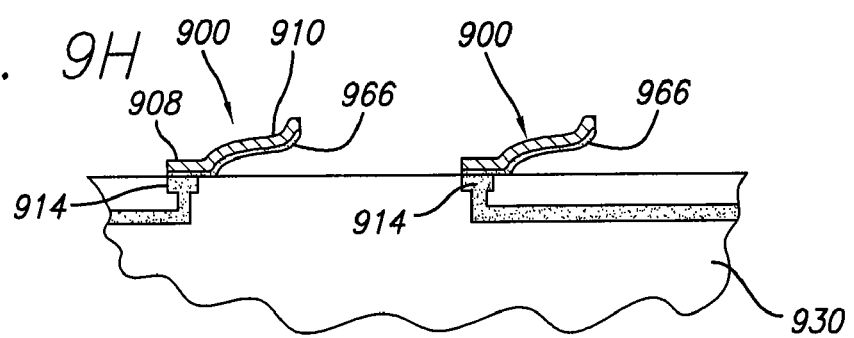

After the uncured portions of the masking layer are dissolved away, exposed areas of seed layer are revealed, comprising mold forms 970 for a spring contact, as shown in FIG. 9F. Mold forms 970 may have the projected shape of the desired microelectronic spring contact. For example, if a triangular beam is desired, the mold form may have a generally triangular shape, in plan view. In the alternative, the mold form may have a generally elongated shape upon which one or more spring contacts may be patterned using a method such as pattern masking. In either case, after the mold form 970 is prepared, one or more layers of resilient material may then be electroplated or otherwise deposited onto the seed layer in the mold forms 970, using various methods as known in the art. Where the seed layer is covered by resist layer 968, no electroplating will occur. In the alternative, a layer of resilient material may be built up using a process such as CVD or PVD selectively applied to mold forms 970 through a mask, eliminating the need for seed layer 966. Alternative line-of-sight deposition methods may make use of a pattern mask, obviating the need for masking layer 968 also. Using any of various deposition methods, a spring contact comprising an integrally formed base 908 and beam 910 is deposited on the mold form 970, as shown in FIG. 9G. The cured resist layer 968, sacrificial material 950, and any residual seed layer 966, are then dissolved away using a suitable etchant that is relatively slow to etch the substrate 930 and the resilient spring material, as known in the art. Freestanding spring contacts 900 mounted to contact pads 914 on electronic component substrate 930, as shown in FIG. 9H, are the result.

Suitable materials for the resilient spring material include but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the palladium group and their alloys; and tungsten, molybdenum and other refractory metals and their alloys. Use of nickel and nickel alloys is particularly preferred. In cases where a solder-like finish is desired, tin, lead, bismuth, indium, gallium and their alloys can also be used. The resilient material may further be comprised of more than one layer. For example, the resilient material may be comprised of two metal layers, wherein a first metal layer, such as nickel or an alloy thereof, is selected for its resiliency properties and a second metal layer, such as gold, is selected for its electrical conductivity properties. Additionally, layers of conductive and insulating materials may be deposited to form transmission line-like structures.

It should be recognized that numerous variations of the above-described sequence of steps will become apparent to one skilled in the art, for producing integrally formed spring contacts according to the present invention. For example, a spring contact structure may be fabricated at an area on a substrate which is remote from a contact pad to which it is electrically connected. Generally, the spring contact structure may be mounted to a conductive line that extends from a contact pad of the substrate to a remote position. In this manner, a plurality of spring contact structures can be mounted to the substrate so that their tips are disposed in a pattern and at positions which are not dependent on the pattern of the contact pads on the substrate. Numerous other alternative methods for forming contoured microelectronic spring contacts for use in the invention are disclosed in the parent application entitled "METHOD FOR FORMING MICROELECTRONIC SPRING STRUCTURES ON A SUBSTRATE," referenced above.

Although various adaptations may be made to the method disclosed herein, in general, a molding or other forming process using a relatively thick layer of sacrificial material, such as layer 950, is preferred for providing adequate z-extension without requiring building up of multiple layers of photoresist. Additionally, use of a deformable sacrificial material provides for duplication and mass production of relatively complex, contoured beam shapes. Accordingly, in the preferred embodiments, the entire contoured microelectronic spring contact (with the exception of optional features such as separate tips) may be defined in a layer of material deposited (such as by electroplating, CVD, or PVD) on the surface of a mold form. The resulting spring contacts are thus comprised of an integral sheet, which may comprise a single layer, or multiple coextensive layers, of resilient, conductive, and/or resistive material. The integrated sheet may be folded and contoured, and is preferably essentially free of any overlapping portion in the direction that the materials are deposited (typically from above the structure towards a substrate), so it may be more readily formed by depositing a layer or layers of material in a single open mold, according to the process described above. However, a substantial amount of overlap may be achieved using some deposition methods, such as electroplating in conjunction with a "robber" to drive electrically charged material under an overhang.

Forming Tool for Microelectronic Spring Molds

Figure 10A:
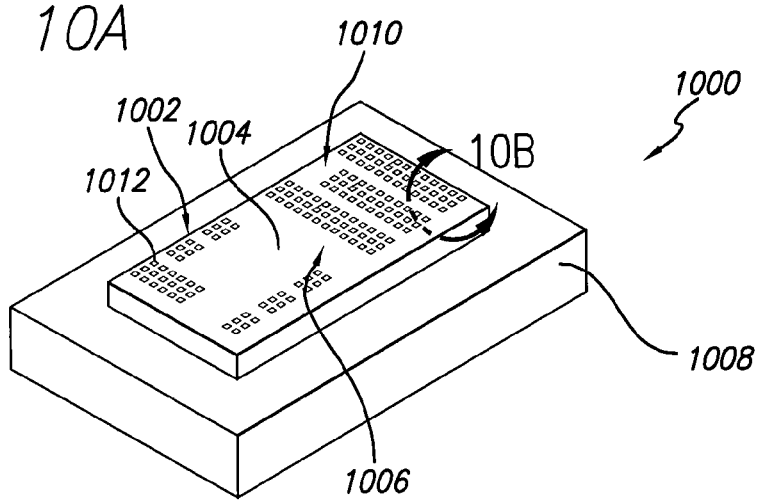
FIG. 10A is a perspective view of an exemplary chip-level forming tool according to the invention.

It should be appreciated that a tool (variously referred to as a forming, stamping, molding, or embossing tool) for forming a molding surface for a contoured microelectronic spring contact is an important and novel aspect of the present invention. An exemplary chip-level forming tool 100 is shown in FIG. 10A. Forming tool 1000 comprises a base 1002 comprised of a tool material. The tool material may be any material which is sufficiently hard, strong, and formable on the desired scale. A wide variety of materials are suitable; however, for use with the methods disclosed herein, preferred materials include metals such as nickel, steel, or aluminum; relatively hard plastics such as polyamides, polyimides, and epoxies; formable nonmetallic inorganic materials such as glass and fused silica; and selected photoresist materials such as SU-8. In an embodiment of the invention, the tool material is provided with microscopic pores to remove gas that may become trapped between the forming tool and the molding substrate during a stamping operation. Such pores may be provided by fabricating the forming tool out of a porous material such as a Micropore™ glass filter or glass frit. Pores may also be individually machined (such as by laser ablation) at the locations where gases are most likely to become trapped. A smooth, gas-permeable membrane such as Gore-Tex™ can also be applied over a porous surface to increase lubricity and act as a release agent during molding operations. To reduce or eliminate the need for pores and gas permeability, the forming tool may be applied in a low vacuum environment.

Base 1002 comprises an embossing face 1004 on which a contoured embossing surface 1010, comprising at least one embossing tooth 1012, is disposed. In an embodiment of the invention, a plurality of embossing teeth 1006 are disposed on embossing face 1004, as shown in FIG. 10A. Each embossing tooth 1012 of teeth 1006 is configured to form a mold for a freestanding resilient microelectronic spring when tool 1000 is impressed into a layer of moldable material. In an embodiment of the invention, each tooth 1012 of the plurality of teeth 1006 has a substantially identical surface contour, corresponding to a molding surface for a microelectronic spring mold. The teeth 1006 may be arranged in a rectangular array, or in any pattern desired on face 1004. Teeth 1006 may be made substantially identical to each other, or may comprise various different shapes on the same forming tool 1000, depending on the desired spring contacts to be formed.

Although embossing face 1004 is shown as being substantially planar underneath teeth 1006, face 1004 may be provided with non-planar features adjacent to teeth 1006, so long as any such non-planar features do not interfere with the molding function of teeth 1006. For example, embossing face 1004 may be provided with recesses, streets, or through holes (not shown) interspersed between individual ones of teeth 1006, for receiving excess mold material, i.e., flash, when tool 1000 is impressed into a layer of such material. For further example, embossing surface 1010 may be provided with protruding tooling stops or raised seals (not shown) adjacent to a periphery of the embossing face 1004. Such auxiliary features, whether recessed or protruding, may be used to enhance the molding function of tool 1000, but do not alter the essential function of embossing face 1004 and embossing surface 1010 thereon, which is to form a mold for one or more freestanding resilient microelectronic spring contacts. Base 1002 is optionally mounted to a support substrate 1008 for assembly into a multi-faceted forming tool assembly, or for mounting to a stamping jig or stamping equipment.

Figure 10B:
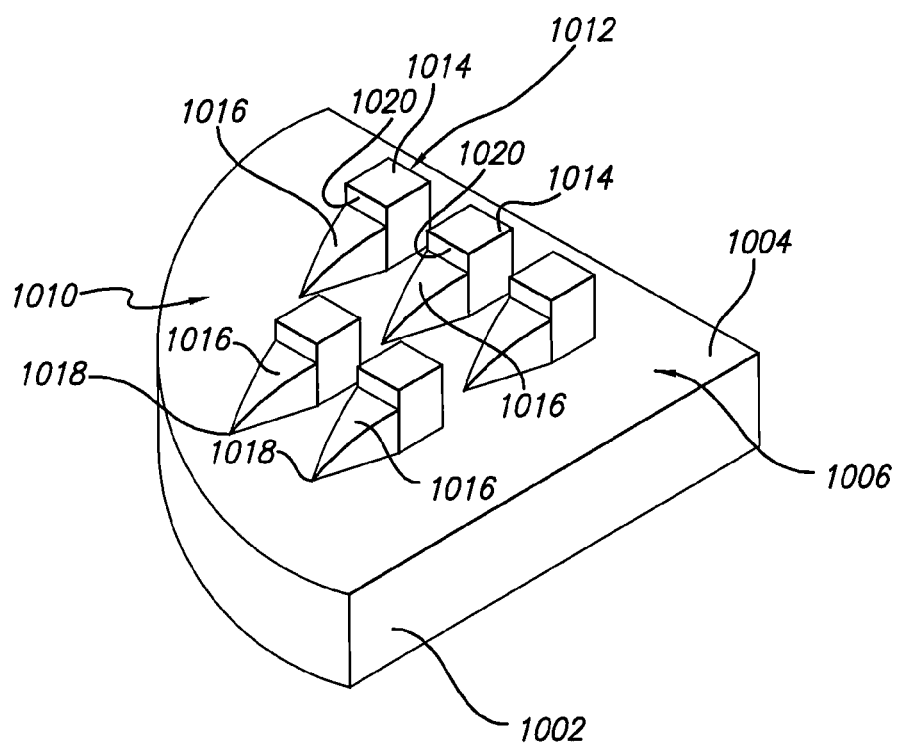
FIG. 10B is a detail perspective view of a portion of the forming tool shown in FIG. 10A, showing an embodiment with protruding embossing surfaces.

Geometric details of forming tool 1000 are shown in FIG. 10B. Each tooth 1012 comprises a protruding area 1014 and a sloped portion 1016 receding from the protruding area 1014. Sloped portion 1016 is configured to form a beam portion of a mold for a freestanding microelectronic spring contact, and defines the contoured shape of the beam. In some embodiments of the invention, sloped portion comprises a contour in a length direction, such as an S-curve, a convex curve, a concave curve, or a sinusoid. For example, FIG. 10B shows each tooth 1012 with a sloped portion 1016 comprising a convex contour. Protruding area 1014 is configured to form a base portion of a mold for a freestanding microelectronic spring contact, which is the area where the base of the spring contact is to be formed. A step 1020 is optionally provided to vertically offset the sloped portion 1016 from area 1014. Alternatively, sloped portion 1016 is blended smoothly into area 1014, depending on the desired spring shape.

In a typical embodiment of the invention, each protruding area 1014 is substantially planar, comprises a maximally protruding portion of each tooth 1012, and is aligned in the same plane as adjacent protruding areas 1014 of adjacent teeth 1006, as shown in FIG. 10B. This configuration is preferred for forming base portions of molds on substantially planar substrates. Similarly, in a typical embodiment, each distal end 1018 of sloped portions 1016 is aligned in the same plane as adjacent distal ends 1018, to form molding surfaces for spring contacts with co-planar tips. However, for providing spring molds for non-planar substrates, protruding areas 1014, and distal ends 1018 may be configured to not be co-planar with corresponding portions of adjacent teeth 1006.

Various exemplary configurations for molding teeth, and other methods for making forming tools, are described in the parent application entitled "TOOL FOR FORMING MICROELECTRONIC SPRING STRUCTURES ON A SUBSTRATE" and referenced above. It should be appreciated that the invention is not limited to the particular shapes disclosed therein, and encompasses any shape for forming a mold for a freestanding microelectronic spring having a sloped beam. In addition, the invention encompasses forming tools having teeth with various different shapes, as well as tools having only identical teeth on the embossing surface. It should further be appreciated that a forming tool may be configured to function as one of two or more forming tools for successive application to a molding substrate, without departing from the scope of the invention.

Figure 10C:
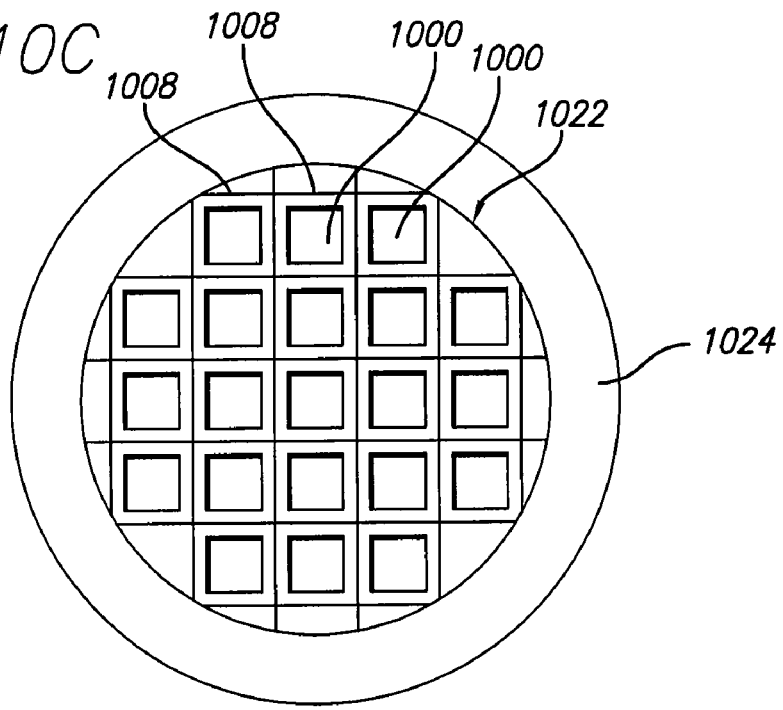
FIG. 10C is a plan view of an exemplary wafer-level forming tool.

Chip-level forming tools, such as shown in FIG. 10A, may be assembled into larger tool assemblies, such as the wafer level forming tool shown in plan view in FIG. 10C. Each forming tool 1000, optionally mounted to a support substrate 1008, is arranged on an assembly substrate 1024 to form wafer-level tool 1022. Individual forming tools 1000 may be arranged in an array on substrate 1024 corresponding to pattern of dice on the wafer. In this configuration, a plurality of microelectronic spring molds may be formed in parallel (that is, during a single process) on all dice, or a selected portion of dice, on a semiconductor wafer. It should be apparent that various configurations of individual forming tools 1000 may be assembled in various arrangements, without departing from the scope of the invention. For example, a single tool 1000 may be configured to form spring molds on more than one die at a time. For further example, a wafer lever tool 1022 may be configured to contact only a portion of dice on a wafer. Assembly of a larger forming tool, such as wafer-level tool 1022, from individual units, such as chip-level tool 1000, provides advantages associated with assemblies, such as greater versatility, ease of repair, and higher yield. However, a wafer-level forming tool may also be formed out of an integrated piece of tool material, if desired.

Figure 10D:
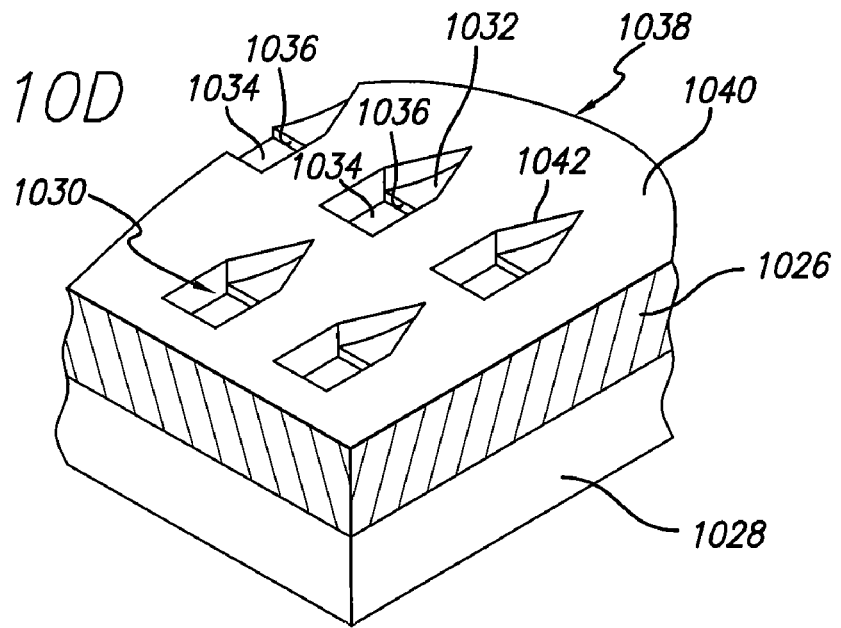
FIG. 10D is a detail perspective view of a typical impression made by the tool shown in FIG. 10B in a moldable substrate.
Figure 11A:
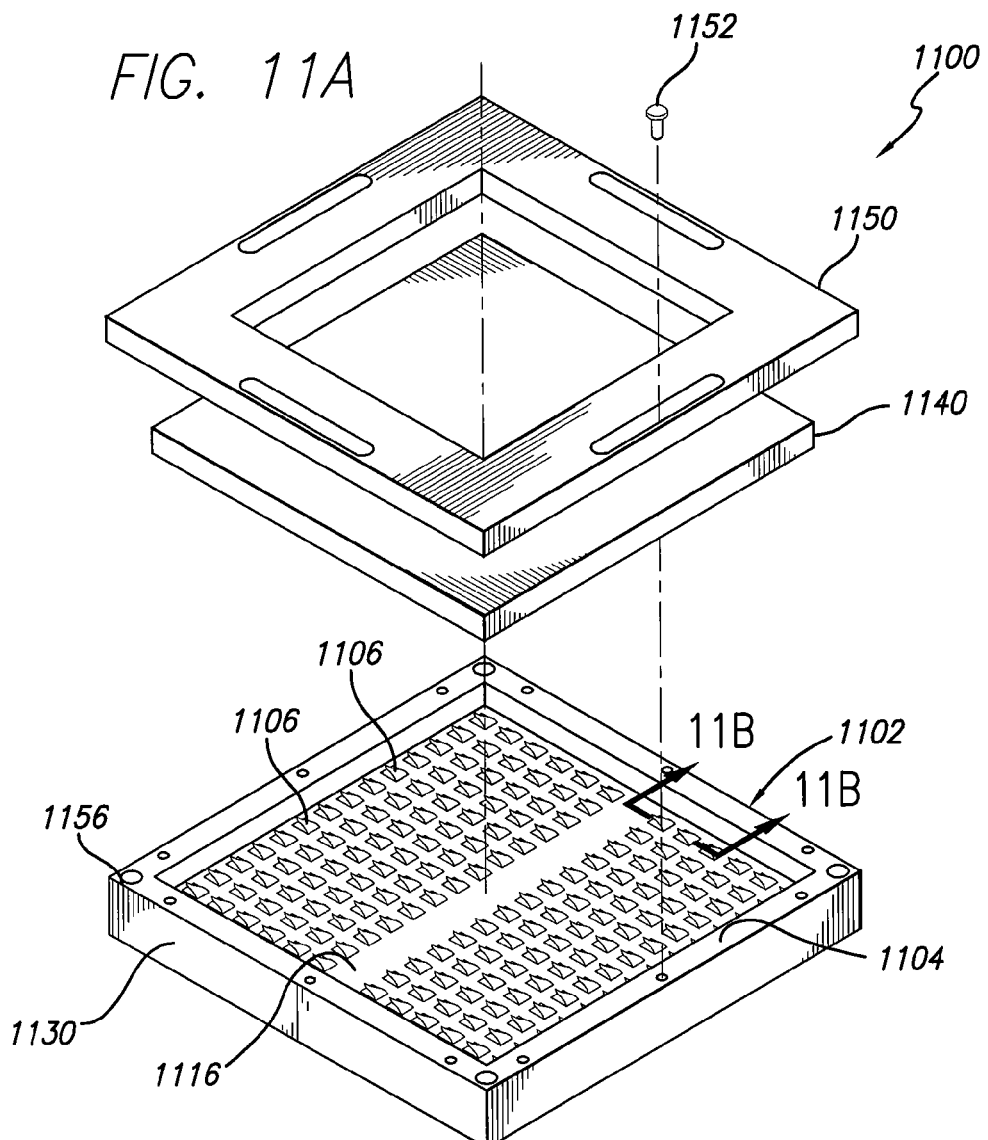
FIG. 11A is a perspective exploded assembly view of an integrated circuit (LGA) socket with contoured microelectronic spring contacts according to the invention.

FIG. 10D shows a partial perspective view of a layer of moldable material 1026 after being impressed with a forming tool such as the tool shown in FIG. 11A. A plurality of molds for microelectronic spring contacts, such as mold 1030, have been formed in a surface 1040 of moldable layer 1026. Each mold 1030 comprises a beam molding surface 1032, for a beam of a microelectronic spring contact, and a base molding surface 1034, which preferably comprises an exposed surface of the underlying, relatively hard and non-moldable substrate 1028. Alternatively, the base molding surface 1034 is adjacent to the surface of substrate 1028, and a portion of moldable layer 1026 is removed under base molding surface 1034 in a subsequent step. Each mold 1030 optionally includes a stepped portion 1036, corresponding to an optional step, such as step 1020 shown in FIG. 10B, on tooth 1012. The forming tool 1000 is comprised of a material harder than moldable layer 1026, and is preferably coated with, or comprised of, a material that will not adhere to layer 1026, so that the forming tool may be cleanly removed after molding. Where molds 1030 are recessed into the mold material, as shown in FIG. 10B, each mold 1030 is provided with a lip 1042. Lip 1042 may be flush with the side walls of recessed mold 1030 (as shown); alternatively, lip 1042 may overhang the side walls. Molds 1030 are suitable for forming microelectronic spring contacts, as further described in the co-pending parent applications referenced above, and in particular, the application entitled "METHOD FOR FORMING MICROELECTRONIC SPRING STRUCTURES ON A SUBSTRATE."

LGA Socket Assemblies

Like composite spring contacts, the integrally formed contacts according to the present invention, such as contoured microelectronic spring contacts, are well suited for use in LGA production sockets, while offering the potential advantages of lower cost, finer pitch, higher contact density, and lower contact force. FIG. 11A shows an exploded view of an LGA socket assembly 1100 with contoured microelectronic spring contacts 1106. LGA socket assembly comprises a lid 1150, an LGA package 1140, and an LGA alignment frame 1102 with microelectronic spring contacts 1106. LGA alignment frame 1102 is a type of integrated circuit socket, comprised of a substrate 1130 having a mounting face 1132, and a plurality of contoured microelectronic spring contacts 1106 mounted to face 1132 and oriented to make contact with corresponding pads (hidden from view in FIG. 11A) of the LGA package 1140. Any number of microelectronic spring contacts 1106 may be present on face 1132. In typical applications, the number of spring contacts will be between about three hundred and about three thousand, although fewer or more contacts may also be provided. The spring contacts are typically disposed on a pitch of between about 0.5 and 1.5 mm (about 20 to 60 mil), although finer or coarser pitches may be accommodated, if desired. It should be appreciated, therefore, that for illustrative clarity the spring contacts 1106 shown in FIG. 11A are not drawn to a scale that reflects typical sizes and contact densities for LGA packages. In most applications, the contact sizes would be smaller, and the contact density higher, than that illustrated. A stop structure 1116 is optionally provided on face 1132 between all (or between selected ones) of microelectronic spring contacts 1106.

LGA package assembly may be configured in various different configurations. In the configuration shown, the mounting face 1132 is surrounded by a raised mounting frame 1104 which is integral with substrate 1130. Threaded holes 1154 are provided for fasteners 1152 (one of many shown), which attach lid 1150 to the LGA alignment frame 1102. Mounting frame 104 may also be provided with through holes 1156 for handling purposes. The raised mounting frame 1104 is configured to fit around LGA package 1140, which is compressed against the spring contacts 1106 (and against the stop structure 1116, if present) by lid 1150. Lid 1150 is optionally provided with at least one compression spring, such as a leaf spring, on its underside (not shown), to bear against LGA package 1140, as known in the art. Various other LGA package assembly configurations may be suitable. For example, a hinged lid provided with a compression spring to compress LGA package 1140 against spring contacts 1106 may be provided, in lieu of the separate lid 1150.

Figure 11B:
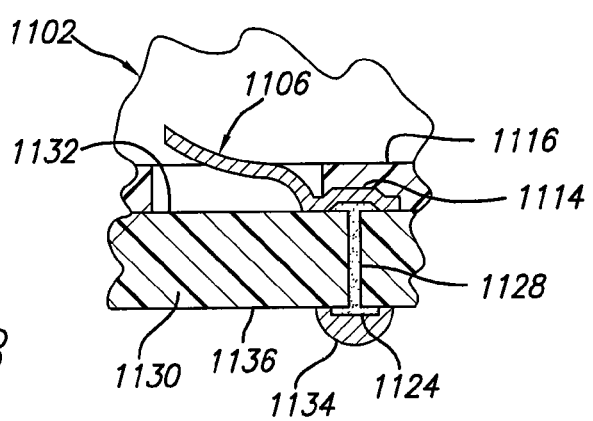
FIG. 11B is a cross-sectional view showing a detail of the integrated circuit socket shown in FIG. 11A.

FIG. 11B shows a typical detail of a contoured microelectronic spring 1106 on substrate 1130. Substrate 1130 is preferably comprised of a conventional packaging material, such as FR-4, ceramic, BT resin, or other available material. Substrate 1130 is prepared for mounting spring contacts 1106 by planarization of face 1132 as known in the art. Spring contact 1106 is preferably a contoured microelectronic spring contact according to the present invention, and may be configured in various different shapes, according to requirements of the application. Each spring contact 1106 is mounted at its base to a pad or terminal 1114 on face 1132, which is connected by via 1128 to a corresponding pad or terminal 1124 on an opposite face 1136 of substrate 1130. The tip of each contact 1106 is positioned to contact a corresponding pad on LGA package 1140. Each contact is optionally provided with a stop structure 1116, which protects the spring contacts 1106 from over-compression, and thereby may simplify the mounting of an LGA package in the alignment frame 1102. The LGA alignment frame may be connected to a system board using any conventional method, such as a solder ball or bump 1134 between terminal 1124 and a corresponding terminal on the system board. In the alternative, a contoured microelectronic spring contact may be provided on the lower terminal 1124, or on a corresponding terminal of the system board, for connecting to lower terminal 1124. Various other configurations for LGA package assemblies using contoured microelectronic spring contacts according to the present invention will be apparent to one skilled in the art.

Interposers, and Contacts for Use Thereon

The contoured spring contacts of the present invention are also suitable for use on interposer substrates in lieu of prior art interconnection elements, such as the composite microelectronic spring contacts used on interposers as disclosed, for example, in the above referenced U.S. Pat. No. 5,974,662. As known in the art, an interposer is a generally planar, relatively thin substrate having two opposite surfaces (such as an upper surface and a lower surface) and a plurality of outwardly extending resilient interconnection elements on both surfaces. Each interconnection element on one surface (e.g., an upper surface) is connected to a corresponding interconnection element on the opposite surface (e.g., a lower surface). Interposers are typically used to compensate for non-planarity between two mating substrates, such as between a probe card and a device under test.

Figure 12A:
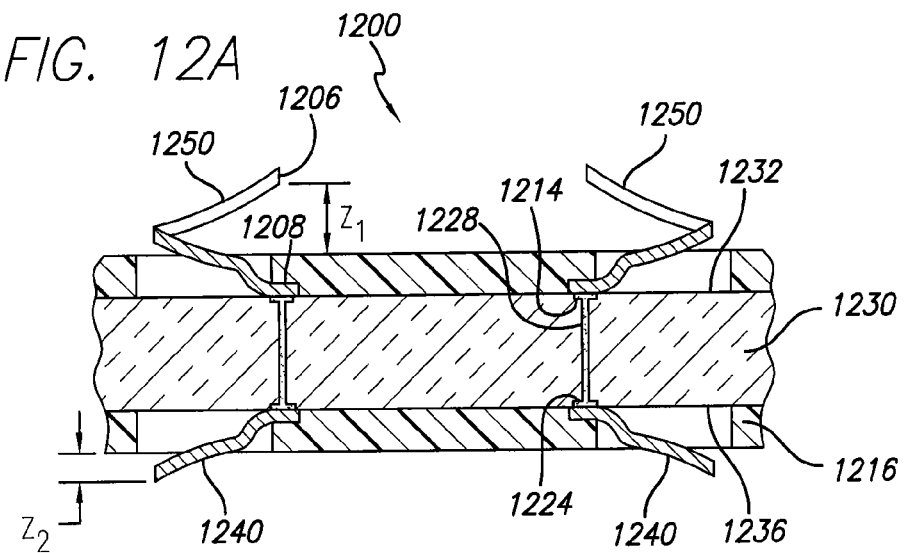
FIG. 12A is a cross-sectional view showing a portion of an interposer with contoured microelectronic spring contacts.
Figure 12B:
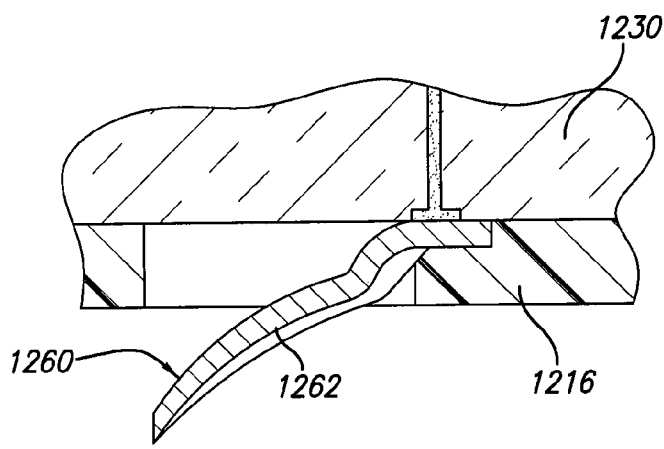
FIG. 12B is a cross-sectional view of an exemplary alternative embodiment of a microelectronic spring suitable for use on an interposer or other electronic component.

FIGS. 12A-B show details of an exemplary portion of an interposer 1200 provided with contoured spring contacts 1240, 1250, and/or 1260 according to the present invention. A design criteria of particular importance for spring contacts used on interposers is the working range of the spring contact, which is the portion of the elastic range of deflection of the spring over which the contact force is within a usable range. For example, if the contact force at the spring tip varies between 0 grams when the spring contact is undeflected to 10 grams at the elastic limit of the spring contact, and the minimum contact force required to make a reliable electrical contact is one gram while the maximum allowable contact force is nine grams, the working range of the spring contact will be approximately 80% of its elastic range, provided that the contact force varies in an approximately linear fashion over the elastic range. In an interposer, the working range of the spring contacts on each surface should be sufficient to compensate for—that is, greater than—non-planarity between the mating substrate or device for which the interposer is intended to compensate.

The working range of a spring contact which is provided with a stop structure, such as stop structure 1216 shown in FIGS. 12A-B, will typically be a fixed percentage (e.g., 80%) of the height of the spring tip 1206 over the distal surface of the stop structure (sometimes called z-extension), shown as the distances "$z_1$" and "$z_2$," for the upper and lower surfaces of interposer 1200, respectively. The total working range "Z" of the interposer will then be a fixed percentage of the sum ($z_1+z_2$) of the z-extensions for spring contacts on the two opposing surfaces of the interposer. For many applications, the non-planarity of principle concern will be non-parallelism between the mating substrates, which may be expressed as an angular value, e.g., "α." A given interposer of span "L" and total working range Z will thus be capable of compensating for non-parallelism α determined by $\tan^{-1}(Z/L)$. The span L of an interposer is generally fixed by the requirements of the test substrate. Therefore, the total working range Z of the contoured spring contacts, which is in turn related to the z-extension of the spring contacts, will be of particular importance to the compliance of the interposer.

Figure 13:
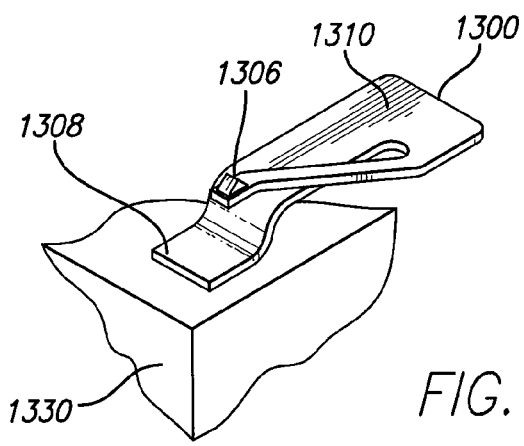
FIG. 13 is a perspective view of an exemplary microelectronic spring having a serpentine plan shape that is contoured to position the tip adjacent to the base.

For many interposer applications, it may be necessary to provide contoured microelectronic spring contacts that have a greater working range than spring contacts for other substrates, such as wafers, dice, and LGA sockets. It is usually not feasible (or if feasible, is not desirable) to achieve an increased working range merely by increasing the slope of a cantilevered beam portion of the spring contact, that is, by orienting the beam more perpendicularly to the substrate 1230. A perpendicularly-oriented beam flexes more like a column than a leaf spring, which typically results in a decrease in working range and undesirable stress concentration. Generally, a beam sloped more than about 60° from the substrate is not preferred, and a preferred beam slope may be substantially less, such as about 30°. Some increase in working range may be realized by making a spring contact of a given shape larger without increasing the beam slope, as exemplified by comparison of larger spring contact 1260, shown in FIG. 12B, with the smaller spring contact 1240 shown in FIG. 12A. Both spring contacts 1240, 1260 have a similar cross-sectional shape, although spring contact 1260 additionally includes a rib 1262 for increased strength and stiffness, because of its longer cantilevered beam length. Larger spring contact 1260 has a larger footprint than smaller spring contact 1240, which may be disadvantageous or not feasible for some applications. A more compact design for increased working range is exemplified by spring contact 1250, shown on the upper surface of substrate 1230 in FIG. 12A. Spring contact 1250 is serpentine in plan, preferably having a tip 1206 vertically offset from base 1208 a relatively small distance, so as to minimize the moment on base 1208 caused by contact forces imposed at tip 1206, and hence to minimize the footprint required for the base. A perspective view of a contoured spring contact 1300 having a serpentine plan form similar to contact 1250 is shown in FIG. 13. Contact 1300 has a beam 1310 with a generally U-shaped plan shape, but it should be apparent that various other curved shapes would provide similar advantages.

Figure 14A:
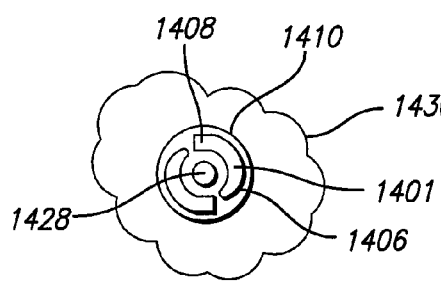
FIGS. 14A-B are plan and elevation views, respectively, of exemplary pairs of microelectronic spring contacts for use on an electronic component such as an interposer or contactor.
Figure 14B:
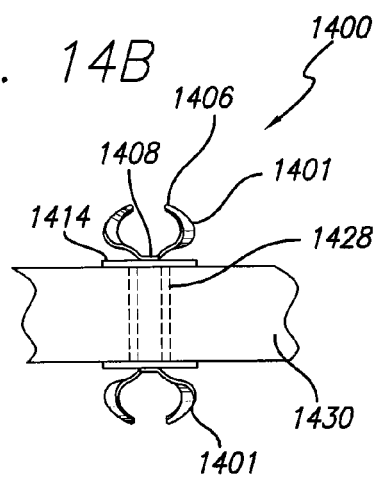

Various other exemplary configurations of contoured microelectronic spring contacts with curved or serpentine plan shapes are shown in FIGS. 14A-B and 15A-B. Opposing pairs 1400 of curved contacts 1401 having a relatively steep slope are shown in FIGS. 14A-B mounted to contact pads 1414 which are connected by via 1428, comprising a plated through hole in substrate 1430. Substrate 1430 may be an interposer, contactor, probe card, or any other suitable electronic component substrate, although a configuration suitable for an interposer is shown. The paired contacts on each contact pad may be for redundancy, for greater current carrying capacity, and or for increased mechanical capacity, i.e., increased strength or stiffness. In the alternative, one contact 1401, or more than two contacts 1401, may be provided on each contact pad 1414. The plan shape of contacts 1401 is shown in FIG. 14A. The curved, semicircular shape of each contact 1401 stays within the periphery of contact pad 1414, such as may be desirable, for example, when a small footprint is required. Adequate z-extension is provided by a relatively steep slope, as evident in the edge view shown in FIG. 14B. Horizontal alignment of tips 1406 and the relative z-extension of contacts 1401 are also shown in the edge view.

Figure 15A:
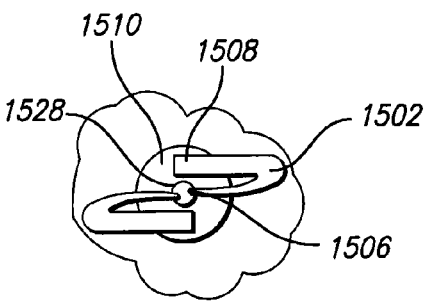
FIGS. 15A-B are plan and elevation views, respectively, of exemplary alternative pairs of microelectronic spring contacts for use on an electronic component such as an interposer or contactor.
Figure 15B:
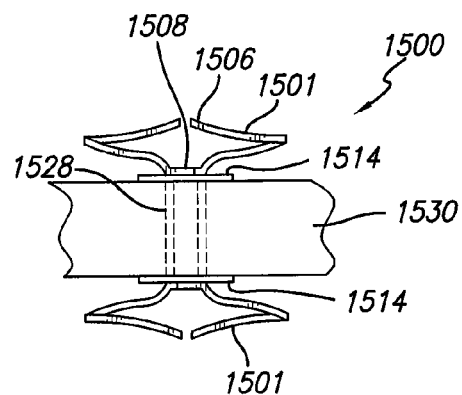

In comparison, opposing pairs 1500 of curved contacts 1501 having a more moderate slope but greater footprint are shown in FIGS. 15A-B, mounted on a substrate 1530 similar to substrate 1430, with annular pads 1514 connected by via 1528. The relatively large footprint and longer beam length are shown in plan view in FIG. 15A. Also visible in FIG. 15A is the relatively close positioning of each tip 1506 to its corresponding base 1508, which advantageously reduces delaminating moments on base 1508. The more moderate slope provided by the longer beam length is shown in the edge view of FIG. 15B. The greater beam length and more moderate slope of contact 1501 provides a lower spring rate and greater working length, as compared to spring contact 1401. The foregoing examples are intended only to illustrate general design principles applicable to contoured spring contacts, and not to provide actual models for use in practice. One skilled in the art may design a contoured spring having the desired properties guided by general principles of mechanical and electrical design, but in most cases, economical development of successful designs for specific applications will require the use of more rigorous analytical tools such as finite element analysis, as well as thorough testing of prototypes.

Figure 16B:
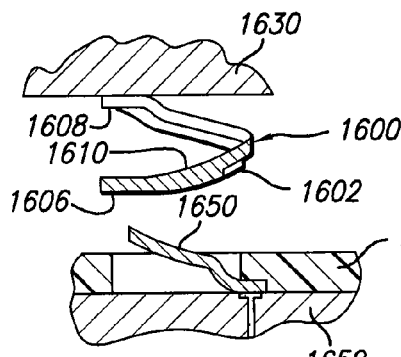
FIGS. 16A-B are plan and elevation views, respectively, of an exemplary microelectronic spring having a pad-like tip.
Figure 16A:
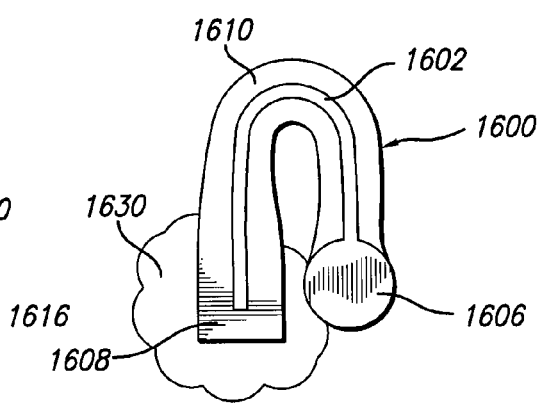

In an alternative embodiment, the working range of a system of microelectronic spring contacts may be increased by arranging a pair of contacts in series. FIG. 16A shows a plan view of an exemplary contoured spring contact 1600, having a pad-like tip 1606 for mating with the wiping contact tip of another spring contact. A cross-sectional, exploded view of a contact 1600 in series with a contact 1650 having a wiping contact is shown in FIG. 16B. Spring contact 1600 is shown with a serpentine beam 1610 and a stiffening rib 1602, but these features are incidental to the function of pad-like tip 1606. Pad-like tip 1606 may have a contact surface that is convex, concave, or substantially flat (as shown), and is preferably configured to make electrical contact with a corresponding spring contact having a wiping tip. Hence, pad-like tip 1606 preferably has a surface finish conductive to making an electrical connection, such as a gold layer. Spring contact 1600 may have a stiffness (spring constant) somewhat higher than, somewhat lower than, or about the same as, the corresponding contact 1650. Certain advantages may accrue from providing a series of contacts 1600, 1650 with distinctly different spring rates, thereby creating a distinctive step in contact force after one of the contacts is fully deflected. For example, supposing that resilient contact 1600 in FIG. 16B is stiffer than the corresponding resilient contact 1650, as substrate 1630 is compressed towards substrate 1652, contact 1650 will be deflected first while contact 1600 is substantially undeflected, until the pad-like tip 1606 contacts the stop structure 1616. Upon further compression, only the second contact 1600 will deflect, and its distinctly higher spring rate provides a signal that that contact 1650 is fully deflected. It should be apparent that the working range of a series of contacts as shown in FIG. 16B, with proper design, will be the sum of the working ranges of each contact in the series.

Test Head Assemblies

Figure 17:
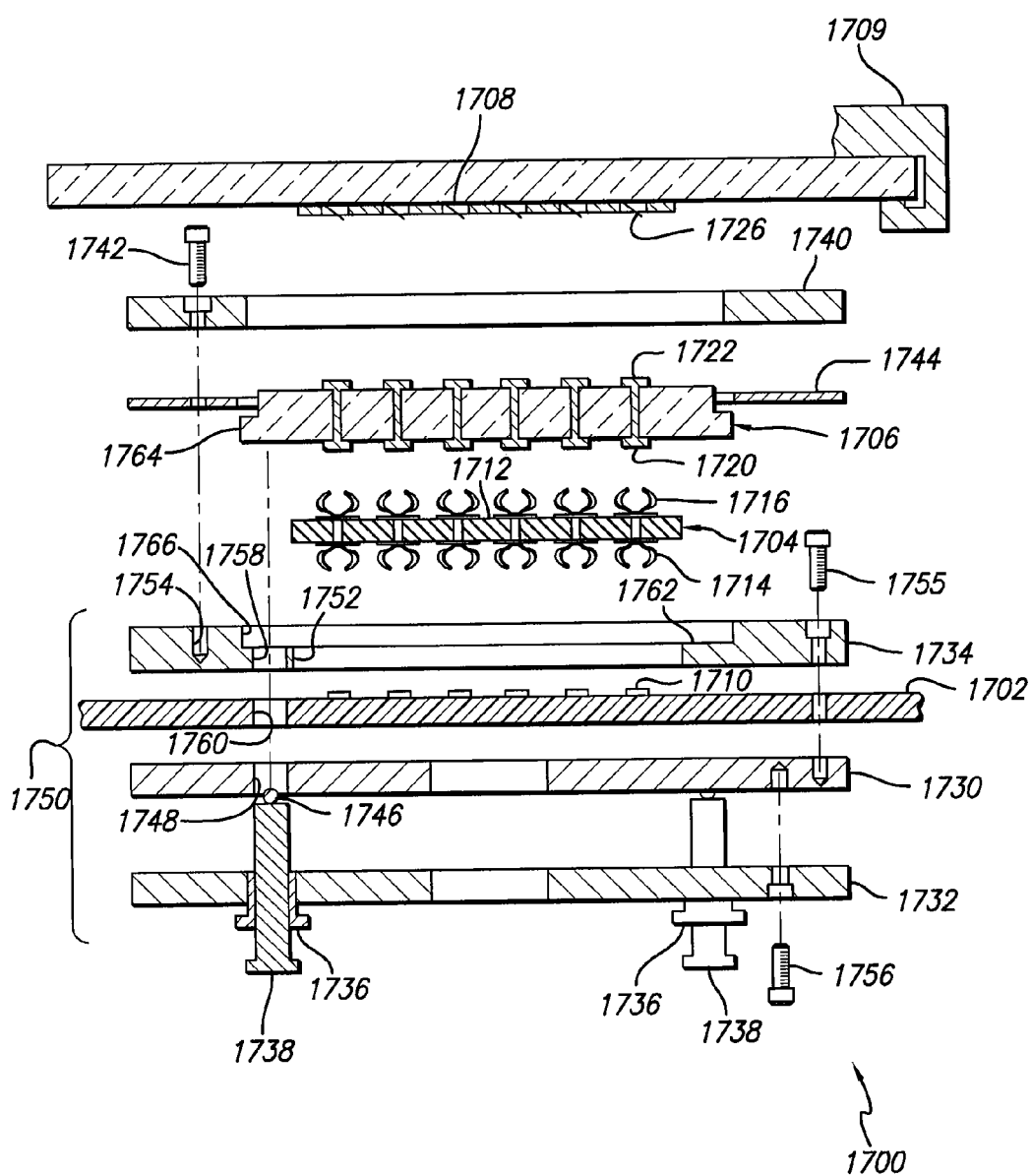
FIG. 17 is a cross-sectional exploded assembly view of a test head assembly including an interposer and a contactor.

FIG. 17 shows an embodiment of a test head assembly 1700 comprising a probe card 1702, an interposer 1704 and a contactor 1706. Assembly 1700 is similar to, and may be compared to, the probe card assembly shown in FIG. 5 of U.S. Pat. No. 5,974,662 (Eldridge, et al.), which is incorporated herein by reference. However, there are several distinguishing differences between the two assemblies, which are made evident by the description that follows. Assembly 1700 is suitable for making temporary interconnections to a semiconductor wafer 1708. In this exploded, cross-sectional view, certain elements of certain components are shown exaggerated, for illustrative clarity. However, the alignment of the various components is properly indicated by the vertical alignment lines in the figure. It should be noted that the microelectronic spring contacts 1714 and 1716 are shown in full, rather than in section.

The probe card 1702 is generally a conventional circuit board substrate having a plurality (six of many shown) of contact areas 1710 disposed on a surface thereof. Although terminals 1710 are shown as raised pads, it should be apparent that the terminals may be provided in a variety of other configurations, including as pads that are flush with the surface of the card, or as recessed terminals. Additional components (not shown) may be mounted to the probe card, such as active and passive electronic components, connectors, and the like. The terminals 1710 on the circuit board may be arranged at a relatively fine pitch, such as about 130 microns (about 5 mil). The position and arrangement of terminals 1710 is preferably related to, but not necessarily identical to, the corresponding position and arrangement of the terminals on the substrate to be tested. For some applications, terminals 1710 may be arranged at coarser pitches, such as about 250-2500 microns (about 10-100 mil). However, coarser pitches will likely require the use of a space transformer. The probe card 1702 may be suitably circular, having a diameter depending on the application, typically on the order of about 30 cm (about 12 inches), or any other desired shape.

The interposer 1704 includes a substrate 1712, which may be comprised of a ceramic, polymer, or other insulating material, as known in the art. As described above, a plurality (six of many shown) of contoured microelectronic spring contacts 1714 are mounted at their bases to and extend from a surface of the substrate 1712, and a corresponding plurality of contoured microelectronic spring contacts 1716 are mounted at their bases to and extend from an opposite surface of the substrate 1712. The microelectronic spring contacts 1714 and 1716 are preferably a species of integrally formed contact, preferably a contoured microelectronic spring contact such as disclosed herein. Any of the aforementioned spring shapes, and various other shapes are suitable for the contoured microelectronic spring contacts 1714 and 1716. Spring contacts 1714 may be shaped the same as spring contacts 1712, as shown in FIG. 17, or differently from spring contacts 1712. Typically, the tips (distal ends) of both the lower plurality 1714 and of the upper plurality 1716 of contoured spring contacts 1714 and 1716 are disposed at a pitch which matches that of the terminals 1710 of the probe card 1702.

The microelectronic spring contacts 1714 and 1716 are illustrated with exaggerated scale, for illustrative clarity. Typically, the microelectronic spring contacts 1714 and 1716 would extend to an overall height of about 500-2500 microns (about 20-100 mils) from respective bottom and top surfaces of the interposer substrate 1712. Generally, the height of the microelectronic spring contacts is dictated by the amount of compliance desired, which will, in turn, be determined by the planarity of the test substrate (e.g., wafer 1708), probe card 1702, and contactor 1706, and the precision with which the position of the test head assembly may be controlled.

The contactor 1706 comprises a substrate 1718, such as a multi-layer ceramic substrate having a first plurality of contact areas or pads 1720 disposed on a surface thereof, corresponding to the plurality of spring contacts 1716 on interposer 1704; and a second plurality of contact areas or pads 1722 disposed on the opposite surface thereof, connected to the first plurality of contact areas. In the embodiment shown, the lower plurality of contact pads 1720 is disposed at the same pitch as the tips of the microelectronic spring contacts 1716 (e.g., 130 microns or 5 mils), and the upper plurality of contact pads 1722 is disposed at the same pitch as the lower plurality of contact pads 1720. In alternative embodiments, the lower plurality of contact pads may be disposed at a coarser pitch than the upper plurality of contact pads, in other words, contactor 1706 may be configured as a space transformer. Contact pads 1720, 1722 may be relatively flush with the opposing surface of contactor (as shown), or may be configured to protrude a distance from the contactor surfaces. In the alternative, resilient interconnection elements, including but not limited to contoured microelectronic spring contacts according to the present invention, or composite spring contacts, may be substituted for either or both pluralities of spring contacts 1716, 1714. For example, contoured spring contacts 1726 may be provided on the contacts pads 1722, to make contact with contact pads or recessed terminals (not shown) on the wafer. In yet another embodiment, spring contacts with pad-like tips, such as spring contact 1600 shown in the foregoing FIGS. 16A-B, may be mounted to contactor 1706 for making contact with spring contacts 1726 on wafer 1708. One skilled in the art may devise other suitable combinations of interconnection elements, without departing from the scope of the invention.

A plurality (six of many shown) of resilient microelectronic spring contacts 1726 may be mounted to wafer 1708, each connected to a corresponding terminal for a circuit in the wafer, and each having at least one contact tip extending from the exposed surface of the wafer. As previously described, these resilient microelectronic spring contacts 1726 may be used to accomplish a degree of pitch spreading of the terminals of wafer 1708, so that the tips of spring contacts 1726 are spaced at a coarser pitch (e.g., 250 microns or 10 mil) than the terminals of the wafer to which they are connected, thereby reducing or eliminating the need for further pitch spreading (space transformation) by contactor 1706. Microelectronic spring contacts 1726 are preferably, but not necessarily, a species of contoured microelectronic spring contacts according to the present invention. Spring contacts 1726 are optionally provided with a stop structure 1728.

Interposer 1704 is disposed over the exposed surface of the probe card 1702, and the contactor 1706 is disposed over interposer 1704, as shown in FIG. 7, so that the microelectronic spring contacts 1714 make a reliable pressure contact with the contact terminals 1710 of the probe card 1702, and so that the microelectronic spring contacts 1716 of interposer 1704 make a reliable pressure contact with the contact pads 1720 of the contactor 1706. Any suitable fixture 1750 for supporting these components and for ensuring such reliable pressure contacts may be employed, an exemplary one of which is further described below.

The test head assembly 1700 may comprise a fixture 1750 having the following components for holding and aligning the interposer 1706 and the contactor 1706 onto the probe card 1702: a rear mounting plate 1730; an actuator mounting plate 1732; and a front mounting plate 1734. Each of the mounting plates may be made of a rigid material such as stainless steel. In addition, the assembly 1700 may comprise a plurality (two of many shown, three is preferred) of differential adjusting mechanisms including an outer differential screw element 1736 and an inner differential screw element 1738; a mounting ring 1740 which is preferably made of a resilient material such as phosphor bronze and which has a pattern of resilient tabs (not shown) extending therefrom; a plurality (two of many shown) of screws 1742 for holding the mounting ring 1738 to the front mounting plate 1734 thereby capturing the contactor 1706; optionally, a spacer ring 1744 disposed between the mounting ring 1740 and the contactor 1706 to accommodate manufacturing tolerances; and a plurality of pivot spheres 1746, each disposed on an actuating end of one of the differential adjusting mechanisms (e.g., on an end of each inner differential screw element 1738).

The rear mounting plate 1730 is a metal plate or ring disposed on the surface of the probe card 1702 opposite to the surface on which the interposer 1704 is mounted. A plurality of holes 1748 extend through the rear mounting plate, each for accommodating one of the adjusting mechanisms.

The actuator mounting plate 1732 may be a metal plate or ring disposed on a surface of the rear mounting plate 1730 opposite to probe card 1702. A plurality of mounting holes 1750 extend through the actuator mounting plate, each for mounting one of the adjusting mechanisms. In use, the actuator mounting plate 1732 may be mounted to the rear mounting plate 1730 in any suitable manner, such as with a plurality of threaded fasteners, for example, a plurality of machine screws like screw 1756.

The front mounting plate 1734 may be a rigid, preferably metal ring. Front mounting plate 1734 may be mounted to the rear mounting plate 1730 in any suitable manner, such as with a plurality of threaded fasteners, for example, a plurality of machine screws like screw 1755 extending through corresponding through holes in probe card 1702, thereby capturing the probe card 1702 securely between the front mounting plate 1734 and rear mounting plate 1730.

The front mounting plate 1734 may be provided with a mounting surface disposed against a surface of probe card 1702, and a large central opening defined by an inner edge 1752, revealing the plurality of contact terminals 1710 of the probe card 1702 to spring contacts 1714, as shown. Front mounting plate 1734 has an inset mounting surface 1762, having a peripheral bezel 1766 to accommodate flange 1764 of contactor 1706. Mounting ring 1740 rests against flange 1764 of contactor 1706, and is fastened to the front mounting plate 1734 by a plurality of fasteners, as exemplified by machine screw 1742 which may be screwed into threaded hole 1754. Spacer ring 1744 is optionally placed between mounting ring 1740 and front mounting ring 1734, for fine adjustment of the gap between contactor 1706 and probe card 1702. A plurality of through holes 1758 (one of many shown) are provided in front mounting plate 1734, each to provide access for one of the differential adjusting mechanisms to bear against contactor 1706 adjacent to inset mounting surface 1762. A corresponding plurality of through holes 1760 and 1748 are aligned through the probe card 1702 and the rear mounting plate, respectively, each to permit passage of one of the adjusting mechanisms which are mounted to the rear mounting plate 1732.

The pivot spheres 1746 are loosely disposed within the aligned through holes 1748, 1758 and 1760, each disposed between an end of one of the inner differential screw elements 1738 and contactor 1706. Each of the outer differential screw elements 1736 thread into one of the threaded holes 1750 of the actuator mounting plate 1732, and the inner differential screw elements 1738 thread into a threaded bore of the outer differential screw elements 1736. Very fine adjustments can be made in the positions of the individual pivot spheres 1746 using such a differential adjustment mechanism, as discussed in more detail in the above-referenced U.S. Pat. No. 5,974,662. Interposer 1704 is preferably configured (by selecting spring contacts with appropriate ranges of motion) to ensure that electrical connections are maintained between the contactor 1706 and the probe card 1702 throughout the contactor's range of adjustment. Other details of test head assembly 1700 are the same as, or may readily be adapted from, the aforementioned probe card assembly disclosed in U.S. Pat. No. 5,974,662.

Figure 18:
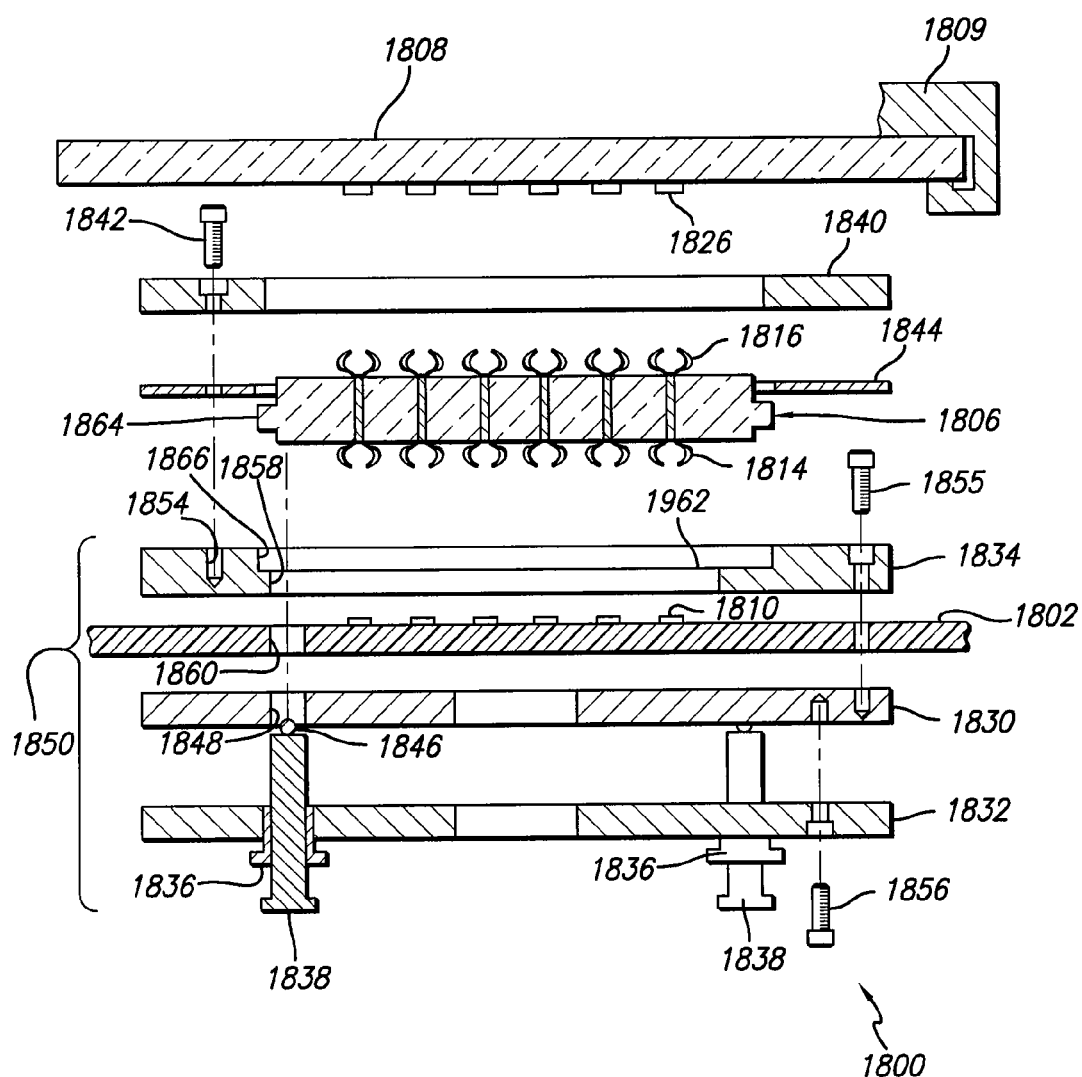
FIG. 18 is a cross-sectional exploded assembly view of a test head assembly with a contactor but no interposer.

In an alternative embodiment, a test head assembly is provided with a contactor having a plurality of contoured microelectronic spring contacts, and the interposer is omitted. FIG. 18 shows a test head assembly 1800 according to an embodiment with no interposer. Except for the configuration of contactor 1806 and the lack of an interposer, assembly 1800 may comprise many of the same elements as assembly 1700, and may be configured similarly. In the embodiment shown in FIG. 18, mounting ring 1840, front mounting plate 1834, probe card 1802, rear mounting plate 1830, actuator plate 1832, the adjustment mechanism comprised of inner and outer screws 1836 and 1838, and the associated screws, through holes, and so forth, comprise a fixture 1850 that is configured the same as the corresponding elements fixture 1750 and its components shown in FIG. 17. Wafer 1808, however, is provided with non-resilient contact pads 1826 instead of resilient contact elements. Contactor 1806 is configured much as if it were an interposer, with interconnected pluralities (six of many shown) of contoured microelectronic spring contacts 1814 and 1816 mounted to its opposing faces. Flange 1864 is configured differently to permit the contactor to fit both inside bezel 1866 and the opening defined by edge 1858. In the alternative, the openings in the front mounting ring 1834 may be configured differently to account for the missing interposer.

Spring contacts 1814 and 1816 are shown to be the same type as shown on interposer 1704 of assembly 1700, but it should be understood that this need not be the case. Any suitable shape may be used, and it may be desirable to configure one or both pluralities of contacts 1816, 1814 to provide a relatively large elastic range of motion. Either or both of wafer 1808 and probe card 1802 may be provided with resilient free-standing spring contacts having a contact tip designed to mate with a corresponding one of spring contacts 1814 and 1816. For example, to provide for greater adjustability between probe card 1802 and contactor 1806, it may be particularly advantageous to provide each contact 1810 of probe card 1802 with a spring contact having a pad-like tip, such as shown in FIGS. 16A and 16B. In this way, contactor 1806 can be provided with adjustability through two sets of linked spring contacts, thereby achieving a range of adjustability comparable to an interposer. Similar resilient contacts may also be provided on wafer 1808.

Test head assemblies according to the present invention will perform as well as or better than prior art assemblies using composite spring contacts, but at a potentially lower cost. Such assemblies can provide substantial advantages over prior art test apparatus, including a high density of contacts that may be as high as the contact density on the devices under test, and suitability for performing wafer-level burn-in and testing, as described in more detail in U.S. Pat. No. 6,064,213, which is incorporated herein by reference. Other features of probe card or test head assemblies described in the foregoing references may readily be incorporated into an assembly according to the present invention. Such variations in the present assembly will be apparent upon inspection of the incorporated references.

Having thus described a preferred embodiment of the substrates with pluralities of contoured microelectronic spring contacts, it should be apparent to those skilled in the art that certain advantages of the within system have been achieved. It should also be appreciated that various modifications, adaptations, and alternative embodiments thereof may be made within the scope and spirit of the present invention. For example, semiconductor dies and wafers, LGA sockets, and test head assemblies have been illustrated, but it should be apparent that the inventive concepts described above would be equally applicable to various other types of substrates and electronic components. The invention is further defined by the following claims.

What is claimed is:

1. An electronic component, comprising:
   at least one face;
   a plurality of microelectronic spring contacts mounted to said at least one face, each of said plurality of microelectronic spring contacts comprising a base mounted to said at least one face, a beam integral with said base and extending along a length thereof from a side of said base away from said at least one face, a free end of said beam opposite to said base, and a contact tip adjacent to said free end of said beam, wherein said beam has an unsupported span between said free end and said base, and wherein each of said microelectronic spring contacts comprises an integral layer of resilient material, wherein said beam comprises a contoured sheet like shape:

a thickness of said beam decreases from said base to said free end of said beam, and a width of said beam decreases from said base to said free end of said beam.

2. The electronic component of claim 1, wherein said electronic component further comprises a die cut from a semiconductor wafer, said die comprising an integrated circuit having a plurality of terminals on said at least one face thereof, wherein selected ones of said plurality of microelectronic spring contacts are connected to selected ones of said plurality of terminals.

3. The electronic component of claim 1, wherein said electronic component further comprises a semiconductor wafer, said wafer comprising a plurality of integrated circuits having a plurality of terminals on said at least one face thereof, wherein selected ones of said plurality of microelectronic spring contacts are connected to selected ones of said plurality of terminals.

4. The electronic component of claim 1, wherein said electronic component further comprises an integrated circuit socket, said socket comprising a back surface opposing said at least one face, said back surface having a plurality of terminals, wherein selected ones of said plurality of microelectronic springs are connected to selected ones of said terminals.

5. The electronic component of claim 1, wherein said electronic component further comprises an interposer, said interposer comprising a substrate having a second surface opposing said at least one face; and a second plurality of microelectronic spring contacts mounted to said second surface, each of said second plurality of microelectronic spring contacts comprising a base mounted to said at least one face, a contoured essentially sheet-like beam integral with said base and extending from a side of said base away from said at least one face, and free end of said beam opposite to said base, wherein said beam has an unsupported span between said tip and said base, and wherein each of said microelectronic spring contacts comprises an integral layer of resilient material;

wherein ones of said second plurality of microelectronic spring contacts are connected to ones of said plurality of microelectronic spring contacts on said at least one face.

6. The electronic component of claim 5, wherein said electronic component further comprises a test head assembly, said assembly comprising:

a fixture, said interposer supported by said fixture; and a contactor coupled to said interposer.

7. The electronic component of claim 1, wherein said electronic component further comprises a test head assembly, said assembly comprising:

a fixture;

a contactor supported by said fixture, said contactor comprising said at least one face; and said at least one face of said contactor being placed in contact with at least one of said microelectronic spring contacts.

8. The electronic component of claim 1, wherein said beam, viewed in a direction normal to said substrate surface, is tapered so as to have a generally triangular shape.

9. The electronic component of claim 1, wherein each of said microelectronic spring contacts is formed by depositing the integral layer of resilient material on a sacrificial layer using a method selected from electroplating, electroless plating, sputtering, chemical vapor deposition, or physical vapor deposition.

10. The electronic component of claim 1, wherein said beam, viewed in a direction normal to said substrate surface, has an offset with respect to a central axis.

11. The electronic component of claim 1, wherein said beam, in a lengthwise sectional view, has an arcuate shape.

12. The electronic component of claim 1, wherein said beam, in a lengthwise sectional view, has a corrugated shape.

13. The electronic component of claim 1, wherein said beam, in a lengthwise sectional view, has a stepped portion near the base.

14. The electronic component of claim 1, wherein said beam, in a cross sectional view, is generally V-shaped.

15. The electronic component of claim 1, wherein said beam, in a cross sectional view, is generally U-shaped.

16. An electronic component, comprising:

at least one face;

a plurality of microelectronic spring contacts mounted to said at least one face, each of said plurality of microelectronic spring contacts comprising a base mounted to said at least one face, a contoured beam integral with said base and extending from a side of said base away from said at least one face, and a free end of said beam opposite to said base, wherein said beam has an unsupported span between said free end and said base, and wherein each of said microelectronic spring contacts comprises an integral layer of resilient material, wherein said spring includes a lengthwise rib extending over at least a portion of the beam, and wherein said lengthwise rib comprises a lengthwise channel that extends into a first surface of the beam and out of a second surface of the beam, the second surface being opposite the first surface.

17. The electronic component of claim 16, wherein said beam, in a lengthwise sectional view, has a stepped portion adjacent the base, and wherein said lengthwise rib extends to said stepped portion.

18. The electronic component of claim 16, wherein said lengthwise rib extends to said base.

19. The electronic component of claim 16, wherein said lengthwise rib extends into said base.

20. The electronic component of claim 16, wherein said lengthwise channel has a regular geometric cross-sectional shape.

21. The electronic component of claim 20, wherein said regular geometric cross-sectional shape is a shape selected from the group consisting of part-rectangular, part-trapezoidal, part-triangular and part-round shapes.

22. The electronic component of claim 16, wherein the cross-sectional dimensions of said lengthwise rib are similar over the length thereof.

23. An electronic component, comprising:

at least one face;

a plurality of microelectronic spring contacts mounted to said at least one face, each of said plurality of microelectronic spring contacts comprising a base mounted to said at least one face, a contoured beam integral with said base and extending from a side of said base away from said at least one face, and a free end of said beam opposite to said base, wherein said beam has an unsupported span between said free end and said base, and wherein each of said microelectronic spring contacts comprises an integral layer of resilient material, wherein said spring includes a lengthwise rib extending over at least a portion of the beam, wherein a cross-sectional dimension of said lengthwise rib differs over the length thereof.

* * * * *